United States Patent
Kurino et al.

(10) Patent No.: US 9,972,757 B2
(45) Date of Patent: May 15, 2018

(54) SURFACE-MODIFIED-METAL-OXIDE-PARTICLE MATERIAL, COMPOSITION FOR SEALING OPTICAL SEMICONDUCTOR ELEMENT, AND OPTICAL SEMICONDUCTOR DEVICE

(71) Applicant: SUMITOMO OSAKA CEMENT CO., LTD., Tokyo (JP)

(72) Inventors: Yasuyuki Kurino, Tokyo (JP); Takeshi Otsuka, Tokyo (JP); Yoichi Sato, Tokyo (JP); Takeru Yamaguchi, Tokyo (JP); Kenji Harada, Tokyo (JP)

(73) Assignee: SUMITOMO OSAKA CEMENT CO., LTD, Tokyo (JP)

( * ) Notice: Subject to any disclaimer, the term of this patent is extended or adjusted under 35 U.S.C. 154(b) by 10 days.

(21) Appl. No.: 14/383,244

(22) PCT Filed: Mar. 8, 2013

(86) PCT No.: PCT/JP2013/056532
§ 371 (c)(1),
(2) Date: Sep. 5, 2014

(87) PCT Pub. No.: WO2013/133430
PCT Pub. Date: Sep. 12, 2013

(65) Prior Publication Data
US 2015/0021643 A1    Jan. 22, 2015

(30) Foreign Application Priority Data

Mar. 9, 2012  (JP) ................................. 2012-053527
Mar. 9, 2012  (JP) ................................. 2012-053529

(51) Int. Cl.
*H01L 33/56*    (2010.01)
*C01G 25/02*   (2006.01)
(Continued)

(52) U.S. Cl.
CPC .............. *H01L 33/56* (2013.01); *B82Y 30/00* (2013.01); *C01G 9/02* (2013.01); *C01G 23/0536* (2013.01);
(Continued)

(58) Field of Classification Search
CPC .......... C09D 183/04; H01L 2924/0002; H01L 2924/00; H01L 23/293; H01L 33/501;
(Continued)

(56) References Cited

U.S. PATENT DOCUMENTS 6,099,911 A * 8/2000 Yano .................... C04B 41/5035
427/397.7
2008/0085985 A1* 4/2008 Nakamura et al. ............. 528/25
2013/0037748 A1* 2/2013 Kato .................. C09K 11/7721
252/301.36

FOREIGN PATENT DOCUMENTS

JP       2003-192831 A       7/2003
JP       2008-304686         * 12/2008
(Continued)

OTHER PUBLICATIONS

Machine translation of JP 2010-095392, retrieved Jul. 25, 2015.*
Machine translation of JP 2008-304686, retrieved Oct. 9, 2015.*

*Primary Examiner* — Michael B Nelson
(74) *Attorney, Agent, or Firm* — Fitch, Even, Tabin & Flannery, LLP

(57) ABSTRACT

There is provided a surface-modified-metal-oxide-particle material including surface-modified-metal-oxide-particles obtained by performing surface modification on metal oxide particles with a surface-modifying material, in which the surface-modifying material includes a predetermined silicone compound, an average primary particle diameter of the metal oxide particles is 3 nm to nm, viscosity at 25° C. is 1000 Pa·s or less, and transmittance of light at a wavelength of 400 nm to 800 nm and a thickness of 1 mm is 60% or
(Continued)

greater, a composition for sealing optical semiconductor element, and an optical semiconductor device using the same.

14 Claims, 2 Drawing Sheets

(51) Int. Cl.
| | |
|---|---|
| *B82Y 30/00* | (2011.01) |
| *C01G 9/02* | (2006.01) |
| *C01G 23/053* | (2006.01) |
| *C09C 1/36* | (2006.01) |
| *C09C 1/04* | (2006.01) |
| *C09C 1/30* | (2006.01) |
| *C08G 77/398* | (2006.01) |
| *H01L 33/50* | (2010.01) |
| *C09D 183/04* | (2006.01) |
| *H01L 23/29* | (2006.01) |
| *C08G 77/20* | (2006.01) |
| *C08K 3/22* | (2006.01) |
| *B82Y 20/00* | (2011.01) |

(52) U.S. Cl.
CPC ........... *C01G 25/02* (2013.01); *C08G 77/398* (2013.01); *C09C 1/043* (2013.01); *C09C 1/3081* (2013.01); *C09C 1/3684* (2013.01); *C09D 183/04* (2013.01); *H01L 33/507* (2013.01); *B82Y 20/00* (2013.01); *C01P 2004/64* (2013.01); *C01P 2006/22* (2013.01); *C08G 77/20* (2013.01); *C08K 2003/2241* (2013.01); *C08K 2003/2244* (2013.01); *H01L 23/293* (2013.01); *H01L 33/501* (2013.01); *H01L 2924/0002* (2013.01); *Y10T 428/2982* (2015.01)

(58) Field of Classification Search
CPC ......... H01L 33/507; H01L 33/56; C08K 3/22; C08K 2003/2241; C08K 2003/2244; B82Y 20/00; B82Y 30/00; C01G 23/0536; C01G 25/02; C01G 9/02; C01P 2004/64; C01P 2006/22; C08G 77/20; C08G 77/398; C09C 1/043; C09C 1/3081; C09C 1/3684; Y10T 428/2982
See application file for complete search history.

(56) References Cited

FOREIGN PATENT DOCUMENTS

| | | |
|---|---|---|
| JP | 2009-24117 A | 2/2009 |
| JP | 2009-091380 A | 4/2009 |
| JP | 2009-120437 A | 6/2009 |
| JP | 2010-95392 A | 4/2010 |
| JP | 2010-100784 A | 5/2010 |
| JP | 2011-26444 A | 2/2011 |
| JP | 2011-105778 A | 6/2011 |
| JP | 2011-144272 A | 7/2011 |
| JP | 2012-21117 A | 2/2012 |
| JP | 2012-22997 A | 2/2012 |
| JP | 2012-31353 A | 2/2012 |
| WO | WO 2008/023746 | * 12/2008 |

* cited by examiner

SURFACE-MODIFIED-METAL-OXIDE-PARTICLE MATERIAL, COMPOSITION FOR SEALING OPTICAL SEMICONDUCTOR ELEMENT, AND OPTICAL SEMICONDUCTOR DEVICE

TECHNICAL FIELD

The present invention relates to a surface-modified-metal-oxide-particle material, a composition for sealing optical semiconductor element, and an optical semiconductor device.

BACKGROUND ART

Silicone compositions are used in an optical semiconductor sealing material and an optical waveguide material since characteristics such as transparency, heat resistance, and light resistance are excellent, and hardness and rubber elasticity are excellent. Among these, a methyl silicone composition has excellent durability such as heat resistance and light resistance. However, the silicone composition has a problem in which refractive index is low, an expansion coefficient is large, gas permeability is large, and adhesion to a substrate is low.

Then, by dispersing metal oxide particles such as zirconium oxide, titanium oxide, and silicon oxide into a silicone compound or combining these, these shortcomings are redeemed, and improvement in function is attained.

For example, a composition for coating a light emitting element obtained by combining fine particles of metal oxide and specific multifunctional polysiloxane (for example, see Patent Literature 1), a silicone resin compound containing zirconia nano particles which are surface-treated with an organosiloxane compound and a terminal alkoxysilyl group-containing silicone resin in which a chain length ratio of the organosiloxane compound and the silicone resin is in a specific range (for example, see Patent Literature 2), a silicone resin composition obtained by reacting metal oxide particles surface-modified with a vinyl terminal silicone-modified material and organohydrogen siloxane (for example, see Patent Literature 3), and a highly transparent silicone composition including silica particles obtained by grafting siloxane (for example, see Patent Literature 4) have been proposed.

In addition, a method of lowering viscosity to 100 Pa·s or less by combining three types of organic modifiers (Patent Literature 5) and a method of hydrophobization-treating inorganic oxide fine powder with an alkyl silazane compound (Patent Literature 6) have been proposed.

PRIOR ART DOCUMENTS

Patent Literature

[Patent Literature 1] Japanese Unexamined Patent Application Publication No. 2009-091380
[Patent Literature 2] Japanese Unexamined Patent Application Publication No. 2011-144272
[Patent Literature 3] Japanese Unexamined Patent Application Publication No. 2011-26444
[Patent Literature 4] Japanese Unexamined Patent Application Publication No. 2009-120437
[Patent Literature 5] Japanese Unexamined Patent Application Publication No. 2009-24117
[Patent Literature 6] Japanese Unexamined Patent Application Publication No. 2003-192831

SUMMARY OF THE INVENTION

Problems to be Solved by the Invention

However, in a case of using multifunctional polysiloxane (Patent Literature 1), there is a restriction on the mixing amount of fine particles of metal oxide and the multifunctional polysiloxane. In particular, in a case where the amount of the fine particles of metal oxide is large, there was a problem in which pores or cracks are generated in a cured product. In addition, in a case of using the multifunctional polysiloxane, unreacted functional groups are likely to remain, and therefore, there was a problem in which composite characteristics after cross-linking were changed over time and durability was poor.

In the case of obtaining a composite composition having a chain length ratio as described in Patent Literature 2, there was a problem in which the chain length of the matrix silicone material (terminal alkoxysilyl group-containing silicone resin) was specified, an alkoxy group was required to be necessarily contained in the matrix silicone, and therefore, this case was not versatile.

In the silicone resin composition obtained by reacting metal oxide particles surface-modified with a vinyl terminal silicone-modified material and organohydrogen siloxane (Patent Literature 3), there was a problem in which a surface modification amount with the silicone-modified material having short chain length was a large amount as 262 parts by weight to 522 parts by weight with respect to 100 parts by weight of zirconium oxide, and in a case of being combining with the organohydrogen siloxane, an improvement effect of refractive index was low. In the method described in Patent Literature 3, there is a problem in which when the surface modification amount is not extremely large, an oil-like state is not obtained, however when the surface modification amount is large, characteristics of metal oxide particles is not drawn out.

In addition, even in any case of Patent Literatures 1 to 3, surface-modified particles are dispersed into a large amount of an organic solvent, and then, mixed with and dispersed into other matrix silicone composition. Although viscosity is not considered in these literatures, in a case where a large amount of solvent is contained in a material, it is necessary to evaporate a large amount of solvent during a process such as sealing into an optical semiconductor element. In consideration of workability in such a process, a solvent contained in a material is preferably as small as possible, and absence of solvent is more preferable. That is, to be mixed with other matrix silicone composition, it is desired that the viscosity of the surface-modified particles is low.

However, when attempting to ensure transparency of the composite, the particle diameter of particles which can be applied is very small. It is necessary to increase the added amount of particles to further improve characteristics such as the refractive index, however, a problem in which when a large amount of particles of a single nanometer size are added, a distance between the particles is extremely close, particles in this particle diameter range have a high surface activity, and therefore, viscosity becomes high by the interaction among particles occurs.

In addition, in the case of grafting polysiloxane to silica particles as described in Patent Literature 4, a refractive index improvement effect is not large at all. In addition, since the refractive index of silica which is about 1.45 is close to the refractive index of methyl silicone which is 1.41, transparency is not impaired even when the particle diameter is large, however, in metal oxide particles with the refractive index of 1.8 or greater, transparency is significantly impaired when the particle diameter is larger than 10 nm.

In addition, in the method described in Patent Literature 4, when the particle diameter is small, it is not possible to lower the viscosity of the modified particles by only grafting polysiloxane.

In the method described in Patent Literature 5, there is a problem in which heat resistance is low since the modifier is an organic modifier. In addition, in the method described in Patent Literature 6, there is a problem in which a hydrophobization treatment particle material has a powder shape and has no fluidity.

As described above, an object of the present invention is to provide a surface-modified-metal-oxide-particle material which has low viscosity, and can exhibit excellent characteristics which metal oxide particles combined in a case of being used as a sealing material for an optical element have, and exhibit high transparency, and a composition for sealing optical semiconductor element containing the surface-modified-metal-oxide-particle material. In addition, an object of the present invention is to provide an optical semiconductor device provided with a sealing material having high transparency.

Means for Solving the Problems

As a result of comprehensive studies for solving the above problem, the present inventors found that by making an average primary particle diameter of metal oxide particles be in a predetermined range and making the structure of a silicone compound which is a surface-modifying material for performing a surface modification treatment thereto be a specific structure, the above problem can be solved, thereby completing the present invention.

That is, the present invention is as follows.

[1] A surface-modified-metal-oxide-particle material including surface-modified-metal-oxide-particles obtained by performing a surface modification on metal oxide particles with a surface-modifying material, in which the surface-modifying material includes a silicone compound represented by the following formula (1), the average primary particle diameter of the metal oxide particles is 3 nm to 10 nm, viscosity at 25° C. is 1000 Pa·s or less, and transmittance of light at a wavelength of 400 nm to 800 nm and a thickness of 1 mm is 60% or greater.

[Chem. 1]

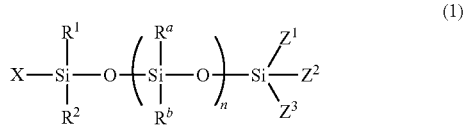

(In the formula (1), X represents a hydrogen atom, an alkyl group having 1 to 6 carbon atoms, or an alkenyl group having 2 to 6 carbon atoms, and each of $R^1$, $R^2$, $R^a$, and $R^b$ independently represents a hydrogen atom, an alkyl group having 1 to 6 carbon atoms, a phenyl group, or an alkenyl group having 2 to 6 carbon atoms. Each of $Z^1$ to $Z^3$ independently represents an alkyl group having 1 to 6 carbon atoms, an alkoxy group having 1 to 6 carbon atoms, a hydroxy group, a halogen atom, or a carboxy group, and at least one of them represents an alkoxy group having 1 to 6 carbon atoms, a hydroxy group, a halogen atom, or a carboxy group. n is an integer of 8 to 100. A plurality of $R^a$ may be the same as or different from each other, and a plurality of $R^b$ may be the same as or different from each other.)

[2] The surface-modified-metal-oxide-particle material according to [1], in which the refractive index of the metal oxide particles is 1.7 or higher, a volume ratio (surface-modifying material/metal oxide particles) of the surface-modifying material with respect to the metal oxide particles is 1.5 to 9, and the refractive index of the material is 1.48 or higher.

[3] The surface-modified-metal-oxide-particle material according to [1] or [2], in which a second surface modification is performed with a silylation material which hydrophobizes a hydroxyl group, and viscosity at 25° C. is 100 Pa·s or less.

[4] The surface-modified-metal-oxide-particle material according to [3], in which the total mixing amount of a first surface-modifying material including the silicone compound and the silylation material is 50 parts by mass to 150 parts by mass with respect to 100 parts by mass of the metal oxide particles.

[5] The surface-modified-metal-oxide-particle material according to any one of [1] to [4], in which a silicone compound represented by the formula (1) is represented by the following formula (2).

[Chem. 2]

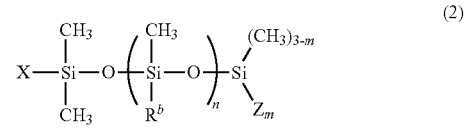

(In the formula (2), X, $R^b$, and n are the same as those in the formula (1). Z represents an alkoxy group having 1 to 6 carbon atoms, a hydroxy group, a halogen atom, or a carboxy group. m is an integer of 1 to 3.)

[6] The surface-modified-metal-oxide-particle material according to any one of [1] to [5], further containing a phosphor.

[7] A composition for sealing optical semiconductor element containing the surface-modified-metal-oxide-particle material according to any one of [1] to [6].

[8] An optical semiconductor device, in which optical semiconductor elements are sealed by a sealing material layer of at least one layer, and a first sealing material layer in contact with the optical semiconductor elements contains the composition for sealing optical semiconductor element according to [7].

[9] The optical semiconductor device according to [8], in which a second sealing material layer having a composition ratio different from the composition for sealing optical semiconductor element according to [7] is formed on the first sealing material layer.

[10] The optical semiconductor device according to [8] or [9], in which a phosphor is further contained in the first sealing material layer.

Advantageous Effects of Invention

According to the present invention, a surface-modified-metal-oxide-particle material which has low viscosity, and can exhibit excellent characteristics which metal oxide particles combined in a case of being used as a sealing material for an optical element have, and exhibit high transparency, and a composition for sealing optical semiconductor element containing the surface-modified-metal-oxide-particle material can be provided.

In particular, since the surface-modified-metal-oxide-particle material and the composition for sealing optical semiconductor element of the present invention have low viscosity, it is not necessary to use a large amount of solvent during a process such as sealing provided when manufacturing an optical semiconductor element (solvent is not substantially necessary). As a result, it is possible to greatly improve workability in the process.

In addition, according to the present invention, it is possible to provide an optical semiconductor device provided with a sealing material having high transparency. Thus, it is possible to improve light extraction efficiency or fluorescence intensity in the optical semiconductor device, and obtain an optical semiconductor device having high emission intensity.

EMBODIMENTS FOR CARRYING OUT THE INVENTION

[1] Surface-Modified-Metal-Oxide-Particle Material

Figure 1:
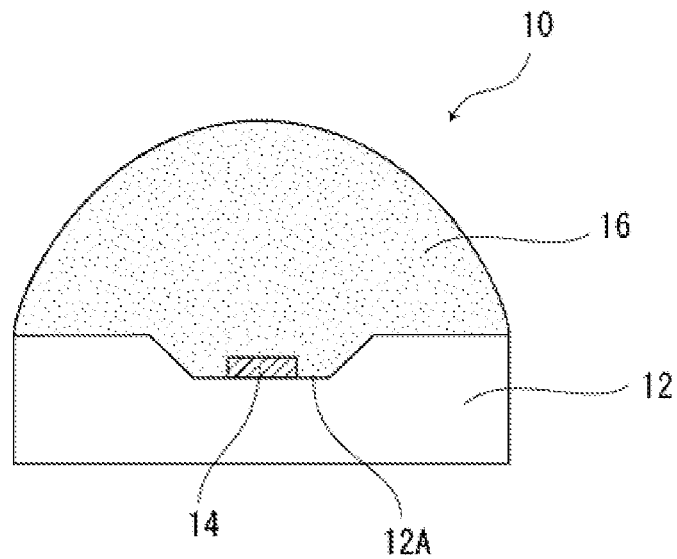
FIG. 1 is a cross-sectional view schematically showing one embodiment of an optical semiconductor device of the present invention.

The surface-modified-metal-oxide-particle material of the present invention includes surface-modified-metal-oxide-particles obtained by surface-modifying metal oxide particles having an average primary particle diameter of 3 nm to 10 nm with a surface-modifying material including the silicone compound having a specific structure.

When the average primary particle diameter is less than 3 nm, since crystallinity is reduced and surface activity is increased, the interaction among particles occurs, and the viscosity of the surface-modified-metal-oxide-particle material is increased. In addition, in a case of using after dispersing the material into a matrix resin (for example, silicone compositions such as a methyl silicone composition), the viscosity of the mixed composition after dispersing is increased. Furthermore, since the specific surface area is large, the amount of a surface-modifying material which coats metal oxide particles becomes large, and it is difficult to obtain a high refractive index.

In addition, when the average primary particle diameter is greater than 10 nm, since a refractive index difference of metal oxide particles and a silicone compound in a surface-modifying material is large, the transmittance by scattering is significantly decreased.

The average primary particle diameter is preferably 4 nm to 8 nm, and more preferably 4 nm to 6 nm.

Moreover, the above-described "average primary particle diameter" refers to a crystallite diameter calculated according to a Scherrer's formula by X-ray diffraction.

As the metal oxides constituting the metal oxide particles, oxides of elements such as zirconium (Zr), titanium (Ti), silicon (Si), aluminum (Al), iron (Fe), copper (Cu), zinc (Zn), yttrium (Y), niobium (Nb), molybdenum (Mo), indium (In), tin (Sn), tantalum (Ta), tungsten (W), lead (Pb), bismuth (Bi), cerium (Ce), antimony (Sb), and germanium (Ge) can be used.

Examples of oxides of these elements include zirconium oxide ($ZrO_2$), titanium oxide ($TiO_2$), silicon oxide ($SiO_2$), aluminum oxide ($Al_2O_3$), iron oxide ($Fe_2O_3$, FeO, and $Fe_3O_4$), copper oxide (CuO and $Cu_2O$), zinc oxide (ZnO), yttrium oxide ($Y_2O_3$), niobium oxide ($Nb_2O_5$), molybdenum oxide ($MoO_3$), indium oxide ($In_2O_3$ and $In_2O$), tin oxide ($SnO_2$), tantalum oxide ($Ta_2O_5$), tungsten oxide ($WO_3$ and $W_2O_5$), lead oxide (PbO and $PbO_2$), bismuth oxide ($Bi_2O_3$), cerium oxide ($CeO_2$ and $Ce_2O_3$), antimony oxide ($Sb_2O_3$ and $Sb_2O_5$), and germanium oxide ($GeO_2$ and GeO).

In addition, composite oxides such as tin-doped indium oxide (ITO), yttria stabilized zirconia (YSZ), and the like may be used.

In particular, versatile silicone resins have low refractive indexes, and therefore, in a case of increasing the refractive index of the composite composition, it is possible to suitably use the metal oxide particles which have high refractive index, are colorless and transparent, and have high hardness. The refractive index of such metal oxide particles is preferably 1.7 or higher, more preferably 1.9 or higher, and further more preferably 2.0 or higher. As the metal oxides having the refractive index of 1.7 or higher, zinc oxide, zirconium oxide, titanium oxide, and aluminum oxide can be exemplified.

The metal oxide particles are surface-treated with a surface-modifying material including the silicone compound having a specific structure, and as the silicone compound, a compound represented by the following formula (1) is exemplified.

[Chem. 3]

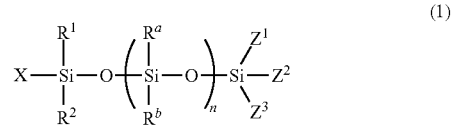

(1)

(In the formula (1), X represents a hydrogen atom, an alkyl group having 1 to 6 carbon atoms, or an alkenyl group having 2 to 6 carbon atoms, and each of $R^1$, $R^2$, $R^a$, and $R^b$ independently represents a hydrogen atom, an alkyl group having 1 to 6 carbon atoms, a phenyl group, or an alkenyl group having 2 to 6 carbon atoms. Each of $Z^1$ to $Z^3$ independently represents an alkyl group having 1 to 6 carbon atoms, an alkoxy group having 1 to 6 carbon atoms, a hydroxy group, a halogen atom, or a carboxy group, and at least one of them represents an alkoxy group having 1 to 6 carbon atoms, a hydroxy group, a halogen atom, or a carboxy group. n is an integer of 8 to 100. A plurality of $R^a$ may be the same as or different from each other, and a plurality of $R^b$ may be the same as or different from each other.)

In the present invention, as the alkyl group having 1 to 6 carbon atoms, a methyl group, an ethyl group, a propyl group, and a butyl group can be preferably exemplified. As the alkenyl group having 2 to 6 carbon atoms, a vinyl group and an allyl group can be preferably exemplified. As the alkoxy group having 1 to 6 carbon atoms, a methoxy group, an ethoxy group, a propoxy group, and a butoxy group can be preferably exemplified.

In consideration of heat resistance, in the formula (1), at least one of X, $R^1$, $R^2$, $R^a$, and $R^b$ is preferably a methyl group.

In addition, at least one of X, $R^1$, $R^2$, $R^a$, and $R^b$ is preferably an alkenyl group having 2 to 6 carbon atoms. In a case of an alkenyl group having 2 to 6 carbon atoms, when curing the mixed composition of the surface-modified-metal-oxide-particle material of the present invention and the silicone composition by a hydrosilylation reaction with a hydrogen silicone in the silicone composition which is a matrix resin, it is possible to prevent the surface-modified-metal-oxide-particles from being phase-separated in the matrix resin, and it is possible to obtain a rigid composite by being crosslinked with the silicone composition. The alkenyl group is preferably disposed at one terminal (that is, a substituent X) of a chain length.

Furthermore, in a case of coating the surface-modified-metal-oxide-particle material of the present invention on the optical semiconductor element and laminating a known material for sealing optical semiconductor element on the coating layer, an alkenyl group in the silicone compound according to the present invention and a hydrogen silicone contained in the material for sealing optical semiconductor element laminated are crosslinked by the hydrosilylation reaction, and therefore, each interface is excellently bonded, and by this, it is possible to reduce light reflection at the interface.

n in the formula (1) is an integer of 8 to 100, and when n is less than 8, a problem in which a steric hindrance caused by a specific silicone compound in among the metal oxide particles which are surface-modified becomes small, thus, the interaction among particles is increased, and as a result, the viscosity is increased, or a problem in which a homogeneous dispersibility in the matrix resin having a large chain length difference with a versatile silicone composition which is a matrix resin is not obtained occurs. On the other hand, when n is greater than 100, a problem in which the specific silicone compound in which the long chain length causes large steric hindrance is not effectively bonded to the metal oxide particles occurs. Furthermore, in both the case where the chain length is long and the case where the chain length is short, the number of the surface-modifying material per a particle unit area is the same number, as the chain length is longer, a relative volume ratio of the metal oxide particles in the surface-modified-metal-oxide-particles according to the present invention is reduced, and the refractive index of the surface-modified-metal-oxide-particle material is lowered. n is preferably 10 to 80, and more preferably 30 to 70.

In addition, in the formula (1), at least one of $Z^1$, $Z^2$, and $Z^3$ is an alkoxy group, a hydroxy group, a halogen atom, or a carboxy group, and this is because these are strongly bonded to hydroxyl groups on the metal oxide particle surface by a hydrolysis, condensation, or hydrogen bond. An alkoxy group and a hydroxy group are preferable.

The silicone compound represented by the above-described formula (1) is preferably a silicone compound represented by the following formula (2).

[Chem. 4]

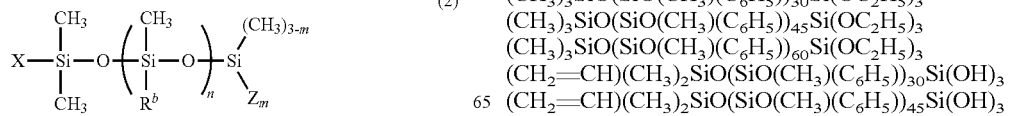

(2)

(In the formula (2), X, $R^b$, and n are the same as those in the formula (1). Z represents an alkoxy group having 1 to 6 carbon atoms, a hydroxy group, a halogen atom, or a carboxy group. m is an integer of 1 to 3.)

Specifically, as the silicone compound according to the present invention, the followings are preferable.

$(CH_3)_3SiO((SiOCH_3)_2)_{30}Si(OCH_3)_3$
$(CH_3)_3SiO((SiOCH_3)_2)_{45}Si(OCH_3)_3$
$(CH_3)_3SiO(SiO(CH_3)_2)_{60}Si(OCH_3)_3$
$(CH_3)_3SiO(SiO(CH_3)_2)_{30}Si(OC_2H_5)_3$
$(CH_3)_3SiO(SiO(CH_3)_2)_{45}Si(OC_2H_5)_3$
$(CH_3)_3SiO(SiO(CH_3)_2)_{60}Si(OC_2H_5)_3$
$(CH_2=CH)(CH_3)_2SiO(SiO(CH_3)_2)_{30}Si(OCH_3)_3$
$(CH_2=CH)(CH_3)_2SiO(SiO(CH_3)_2)_{45}Si(OCH_3)_3$
$(CH_2=CH)(CH_3)_2SiO(SiO(CH_3)_2)_{60}Si(OCH_3)_3$
$(CH_2=CH)(CH_3)_2SiO(SiO(CH_3)_2)_{30}Si(OC_2H_5)_3$
$(CH_2=CH)(CH_3)_2SiO(SiO(CH_3)_2)_{45}Si(OC_2H_5)_3$
$(CH_2=CH)(CH_3)_2SiO(SiO(CH_3)_2)_{60}Si(OC_2H_5)_3$
$H(CH_3)_2SiO(SiO(CH_3)_2)_{30}Si(OCH_3)_3$
$H(CH_3)_2SiO(SiO(CH_3)_2)_{45}Si(OCH_3)_3$
$H(CH_3)_2SiO(SiO(CH_3)_2)_{60}Si(OCH_3)_3$
$(CH_3)_3SiO(SiO(CH_3)_2)_{30}Si(OH)_3$
$(CH_3)_3SiO(SiO(CH_3)_2)_{45}Si(OH)_3$
$(CH_3)_3SiO(SiO(CH_3)_2)_{60}Si(OH)_3$
$(CH_2=CH)(CH_3)_2SiO(SiO(CH_3)_2)_{30}Si(OH)_3$
$(CH_2=CH)(CH_3)_2SiO(SiO(CH_3)_2)_{45}Si(OH)_3$
$(CH_2=CH)(CH_3)_2SiO(SiO(CH_3)_2)_{60}Si(OH)_3$
$H(CH_3)_2SiO(SiO(CH_3)_2)_{30}Si(OH)_3$
$H(CH_3)_2SiO(SiO(CH_3)_2)_{45}Si(OH)_3$
$H(CH_3)_2SiO(SiO(CH_3)_2)_{60}Si(OH)_3$
$(CH_3)_3SiO(SiO(CH_3)_2)_{30}SiCl_3$
$(CH_3)_3SiO(SiO(CH_3)_2)_{45}SiCl_3$
$(CH_3)_3SiO(SiO(CH_3)_2)_{60}SiCl_3$
$(CH_2=CH)(CH_3)_2SiO(SiO(CH_3)_2)_{30}SiCl_3$
$(CH_2=CH)(CH_3)_2SiO(SiO(CH_3)_2)_{45}SiCl_3$
$(CH_2=CH)(CH_3)_2SiO(SiO(CH_3)_2)_{60}SiCl_3$
$(CH_3)_3SiO(SiO(C_6H_5)_2)_{30}Si(OH)_3$
$(CH_3)_3SiO(SiO(C_6H_5)_2)_{45}Si(OH)_3$
$(CH_3)_3SiO(SiO(C_6H_5)_2)_{60}Si(OH)_3$
$(CH_3)_3SiO(SiO(C_6H_5)_2)_{30}Si(OCH_3)_3$
$(CH_3)_3SiO(SiO(C_6H_5)_2)_{45}Si(OCH_3)_3$
$(CH_3)_3SiO(SiO(C_6H_5)_2)_{60}Si(OCH_3)_3$
$(CH_3)_3SiO(SiO(C_6H_5)_2)_{30}Si(OC_2H_5)_3$
$(CH_3)_3SiO(SiO(C_6H_5)_2)_{45}Si(OC_2H_5)_3$
$(CH_3)_3SiO(SiO(C_6H_5)_2)_{60}Si(OC_2H_5)_3$
$(CH_2=CH)(CH_3)_2SiO(SiO(C_6H_5)_2)_{30}Si(OH)_3$
$(CH_2=CH)(CH_3)_2SiO(SiO(C_6H_5)_2)_{45}Si(OH)_3$
$(CH_2=CH)(CH_3)_2SiO(SiO(C_6H_5)_2)_{60}Si(OH)_3$
$(CH_2=CH)(CH_3)_2SiO(SiO(C_6H_5)_2)_{30}Si(OCH_3)_3$
$(CH_2=CH)(CH_3)_2SiO(SiO(C_6H_5)_2)_{45}Si(OCH_3)_3$
$(CH_2=CH)(CH_3)_2SiO(SiO(C_6H_5)_2)_{60}Si(OCH_3)_3$
$(CH_2=CH)(CH_3)_2SiO(SiO(C_6H_5)_2)_{30}Si(OC_2H_5)_3$
$(CH_2=CH)(CH_3)_2SiO(SiO(C_6H_5)_2)_{45}Si(OC_2H_5)_3$
$(CH_2=CH)(CH_3)_2SiO(SiO(C_6H_5)_2)_{60}Si(OC_2H_5)_3$
$(CH_3)_3SiO(SiO(CH_3)(C_6H_5))_{30}Si(OH)_3$
$(CH_3)_3SiO(SiO(CH_3)(C_6H_5))_{45}Si(OH)_3$
$(CH_3)_3SiO(SiO(CH_3)(C_6H_5))_{60}Si(OH)_3$
$(CH_3)_3SiO(SiO(CH_3)(C_6H_5))_{30}Si(OCH_3)_3$
$(CH_3)_3SiO(SiO(CH_3)(C_6H_5))_{45}Si(OCH_3)_3$
$(CH_3)_3SiO(SiO(CH_3)(C_6H_5))_{60}Si(OCH_3)_3$
$(CH_3)_3SiO(SiO(CH_3)(C_6H_5))_{30}Si(OC_2H_5)_3$
$(CH_3)_3SiO(SiO(CH_3)(C_6H_5))_{45}Si(OC_2H_5)_3$
$(CH_3)_3SiO(SiO(CH_3)(C_6H_5))_{60}Si(OC_2H_5)_3$
$(CH_2=CH)(CH_3)_2SiO(SiO(CH_3)(C_6H_5))_{30}Si(OH)_3$
$(CH_2=CH)(CH_3)_2SiO(SiO(CH_3)(C_6H_5))_{45}Si(OH)_3$
$(CH_2=CH)(CH_3)_2SiO(SiO(CH_3)(C_6H_5))_{60}Si(OH)_3$
$(CH_2=CH)(CH_3)_2SiO(SiO(CH_3)(C_6H_5))_{30}Si(OCH_3)_3$ (CH$_2$=CH)(CH$_3$)$_2$SiO(SiO(CH$_3$)(C$_6$H$_5$))$_{45}$Si(OCH$_3$)$_3$
(CH$_2$=CH)(CH$_3$)$_2$SiO(SiO(CH$_3$)(C$_6$H$_5$))$_{60}$Si(OCH$_3$)$_3$
(CH$_2$=CH)(CH$_3$)$_2$SiO(SiO(CH$_3$)(C$_6$H$_5$))$_{30}$Si(OC$_2$H$_5$)$_3$
(CH$_2$=CH)(CH$_3$)$_2$SiO(SiO(CH$_3$)(C$_6$H$_5$))$_{45}$Si(OC$_2$H$_5$)$_3$
(CH$_2$=CH)(CH$_3$)$_2$SiO(SiO(CH$_3$)(C$_6$H$_5$))$_{60}$Si(OC$_2$H$_5$)$_3$
(CH$_3$)$_3$SiO(SiO(C$_6$H$_5$)$_2$)$_{15}$SiO(SiO(CH$_3$)$_2$)$_{15}$Si(OCH$_3$)$_3$
(CH$_3$)$_3$SiO(SiO(C$_6$H$_5$)$_2$)$_{15}$SiO(SiO(CH$_3$)$_2$)$_{15}$Si(OH)$_3$
(CH$_3$)$_3$SiO(SiO(C$_6$H$_5$)$_2$)$_{15}$SiO(SiO(CH$_3$)$_2$)$_{15}$Si(OC$_2$H$_5$)$_3$
(CH$_2$=CH)(CH$_3$)$_2$SiO(SiO(C$_6$H$_5$)$_2$)$_{15}$SiO(SiO(CH$_3$)$_2$)$_{15}$Si(OCH$_3$)$_3$
(CH$_2$=CH)(CH$_3$)$_2$SiO(SiO(C$_6$H$_5$)$_2$)$_{15}$SiO(SiO(CH$_3$)$_2$)$_{15}$Si(OH)$_3$
(CH$_2$=CH)(CH$_3$)$_2$SiO(SiO(C$_6$H$_5$)$_2$)$_{15}$SiO(SiO(CH$_3$)$_2$)$_{15}$Si(OC$_2$H$_5$)$_3$
(CH$_3$)$_3$SiO(SiO(C$_6$H$_5$)$_2$)$_{30}$O(SiO(CH$_3$)$_2$)$_{30}$Si(OCH$_3$)$_3$
(CH$_3$)$_3$SiO(SiO(C$_6$H$_5$)$_2$)$_{30}$O(SiO(CH$_3$)$_2$)$_{30}$Si(OH)$_3$
(CH$_3$)$_3$SiO(SiO(C$_6$H$_5$)$_2$)$_{30}$O(SiO(CH$_3$)$_2$)$_{30}$Si(OC$_2$H$_5$)$_3$
(CH$_2$=CH)(CH$_3$)$_2$SiO(SiO(C$_6$H$_5$)$_2$)$_{30}$O(SiO(CH$_3$)$_2$)$_{30}$Si(OCH$_3$)$_3$
(CH$_2$=CH)(CH$_3$)$_2$SiO(SiO(C$_6$H$_5$)$_2$)$_{30}$O(SiO(CH$_3$)$_2$)$_{30}$Si(OC$_2$H$_5$)$_3$
(CH$_3$)$_3$SiO(SiO(CH$_3$)$_2$)$_{15}$(SiO(C$_6$H$_5$)$_2$)$_{15}$Si(OCH$_3$)$_3$
(CH$_3$)$_3$SiO(SiO(CH$_3$)$_2$)$_{15}$(SiO(C$_6$H$_5$)$_2$)$_{15}$Si(OH)$_3$
(CH$_3$)$_3$SiO(SiO(CH$_3$)$_2$)$_{15}$(SiO(C$_6$H$_5$)$_2$)$_{15}$Si(OC$_2$H$_5$)$_3$
(CH$_2$=CH)(CH$_3$)$_2$SiO(SiO(CH$_3$)$_2$)$_{15}$(SiO(C$_6$H$_5$)$_2$)$_{15}$Si(OCH$_3$)$_3$
(CH$_2$=CH)(CH$_3$)$_2$SiO(SiO(CH$_3$)$_2$)$_{15}$(SiO(C$_6$H$_5$)$_2$)$_{15}$Si(OC$_2$H$_5$)$_3$
(CH$_3$)$_3$SiO(SiO(CH$_3$)$_2$)$_{30}$Si(CH$_3$)$_2$COOH
(CH$_3$)$_3$SiO(SiO(CH$_3$)$_2$)$_{45}$Si(CH$_3$)$_2$COOH
(CH$_3$)$_3$SiO(SiO(CH$_3$)$_2$)$_{60}$Si(CH$_3$)$_2$COOH
(CH$_2$=CH)(CH$_3$)$_2$SiO(SiO(CH$_3$)$_2$)$_{30}$Si(CH$_3$)$_2$COOH
(CH$_2$=CH)(CH$_3$)$_2$SiO(SiO(CH$_3$)$_2$)$_{45}$Si(CH$_3$)$_2$COOH
(CH$_2$=CH)(CH$_3$)$_2$SiO(SiO(CH$_3$)$_2$)$_{60}$Si(CH$_3$)$_2$COOH

Among these, the following silicone compounds are preferable.
(CH$_3$)$_3$SiO(SiO(CH$_3$)$_2$)$_{30}$Si(OCH$_3$)$_3$
(CH$_3$)$_3$SiO(SiO(CH$_3$)$_2$)$_{45}$Si(OCH$_3$)$_3$
(CH$_3$)$_3$SiO(SiO(CH$_3$)$_2$)$_{60}$Si(OCH$_3$)$_3$
(CH$_2$=CH)(CH$_3$)$_2$SiO(SiO(CH$_3$)$_2$)$_{30}$Si(OCH$_3$)$_3$
(CH$_2$=CH)(CH$_3$)$_2$SiO(SiO(CH$_3$)$_2$)$_{45}$Si(OCH$_3$)$_3$
(CH$_2$=CH)(CH$_3$)$_2$SiO(SiO(CH$_3$)$_2$)$_{60}$Si(OCH$_3$)$_3$
(CH$_3$)$_3$SiO(SiO(CH$_3$)$_2$)$_{30}$Si(OC$_2$H$_5$)$_3$
(CH$_3$)$_3$SiO(SiO(CH$_3$)$_2$)$_{45}$Si(OC$_2$H$_5$)$_3$
(CH$_3$)$_3$SiO(SiO(CH$_3$)$_2$)$_{60}$Si(OC$_2$H$_5$)$_3$
(CH$_2$=CH)(CH$_3$)$_2$SiO(SiO(CH$_3$)$_2$)$_{30}$Si(OC$_2$H$_5$)$_3$
(CH$_2$=CH)(CH$_3$)$_2$SiO(SiO(CH$_3$)$_2$)$_{45}$Si(OC$_2$H$_5$)$_3$
(CH$_2$=CH)(CH$_3$)$_2$SiO(SiO(CH$_3$)$_2$)$_{60}$Si(OC$_2$H$_5$)$_3$
(CH$_3$)$_3$SiO(SiO(CH$_3$)$_2$)$_{30}$Si(OH)$_3$
(CH$_3$)$_3$SiO(SiO(CH$_3$)$_2$)$_{45}$Si(OH)$_3$
(CH$_3$)$_3$SiO(SiO(CH$_3$)$_2$)$_{60}$Si(OH)$_3$
(CH$_2$=CH)(CH$_3$)$_2$SiO(SiO(CH$_3$)$_2$)$_{30}$Si(OH)$_3$
(CH$_2$=CH)(CH$_3$)$_2$SiO(SiO(CH$_3$)$_2$)$_{45}$Si(OH)$_3$
(CH$_2$=CH)(CH$_3$)$_2$SiO(SiO(CH$_3$)$_2$)$_{60}$Si(OH)$_3$
(CH$_3$)$_3$SiO(SiO(CH$_3$)$_2$)$_{30}$SiCl$_3$
(CH$_3$)$_3$SiO(SiO(CH$_3$)$_2$)$_{45}$SiCl$_3$
(CH$_3$)$_3$SiO(SiO(CH$_3$)$_2$)$_{60}$SiCl$_3$
(CH$_2$=CH)(CH$_3$)$_2$SiO(SiO(CH$_3$)$_2$)$_{30}$SiCl$_3$
(CH$_2$=CH)(CH$_3$)$_2$SiO(SiO(CH$_3$)$_2$)$_{45}$SiCl$_3$
(CH$_2$=CH)(CH$_3$)$_2$SiO(SiO(CH$_3$)$_2$)$_{60}$SiCl$_3$
(CH$_3$)$_3$SiO(SiO(CH$_3$)$_2$)$_{30}$Si(CH$_3$)$_2$COOH
(CH$_3$)$_3$SiO(SiO(CH$_3$)$_2$)$_{45}$Si(CH$_3$)$_2$COOH
(CH$_3$)$_3$SiO(SiO(CH$_3$)$_2$)$_{60}$Si(CH$_3$)$_2$COOH
(CH$_2$=CH)(CH$_3$)$_2$SiO(SiO(CH$_3$)$_2$)$_{30}$Si(CH$_3$)$_2$COOH
(CH$_2$=CH)(CH$_3$)$_2$SiO(SiO(CH$_3$)$_2$)$_{45}$Si(CH$_3$)$_2$COOH
(CH$_2$=CH)(CH$_3$)$_2$SiO(SiO(CH$_3$)$_2$)$_{60}$Si(CH$_3$)$_2$COOH The volume ratio (surface-modifying material/metal oxide particles) of the surface-modifying material with respect to the metal oxide particles is 1.5 to 9, preferably 2.0 to 8.0, and more preferably 2.5 to 6.0. When the volume ratio is less than 1.5, since the amount of the surface-modifying material is small, the dispersibility into the silicone composition (matrix resin) is lowered, and transparency is reduced. In addition, when the volume ratio is greater than 9, the refractive index of the surface-modified-metal-oxide-particle material is lowered, and for example, since the refractive index of a methyl silicone composition (matrix resin) is about 1.41, it is not possible to increase the refractive index even by mixing and dispersing the surface-modified-metal-oxide-particle material.

As a surface modification method with a surface-modifying material, a wet method and a dry method can be exemplified. The wet method is a method in which the metal oxide particles, the surface-modifying material, and if necessary, a catalyst for hydrolyzing the surface-modifying material are put into a solvent, and dispersion is preformed while surface-modifying the metal oxide particles in the solvent by adding energy from the outside such as heating and stirring or a bead media. In addition, the dry method is a method in which the surface-modified-metal-oxide-particles are obtained while mixing the metal oxide particles and the surface-modifying material by a kneader.

Moreover, in the surface-modifying material, together with the specific silicone compound, other modifying materials may be used in combination. As the modifying materials which can be used in combination, silane compounds such as vinyl trimethoxysilane, alkyl silane, and the like can be exemplified. The content of the surface-modifying material in this case is preferably 50% by mass or less, and more preferably 40% by mass or less.

Furthermore, the surface-modified-metal-oxide-particle material of the present invention is preferably formed by performing a second surface modification with a silylation material which hydrophobizes a hydroxyl group after performing a surface modification (first surface modification) with the surface-modifying material. At this time, the viscosity at 25° C. is preferably 100 Pa·s or less.

Figure 3:
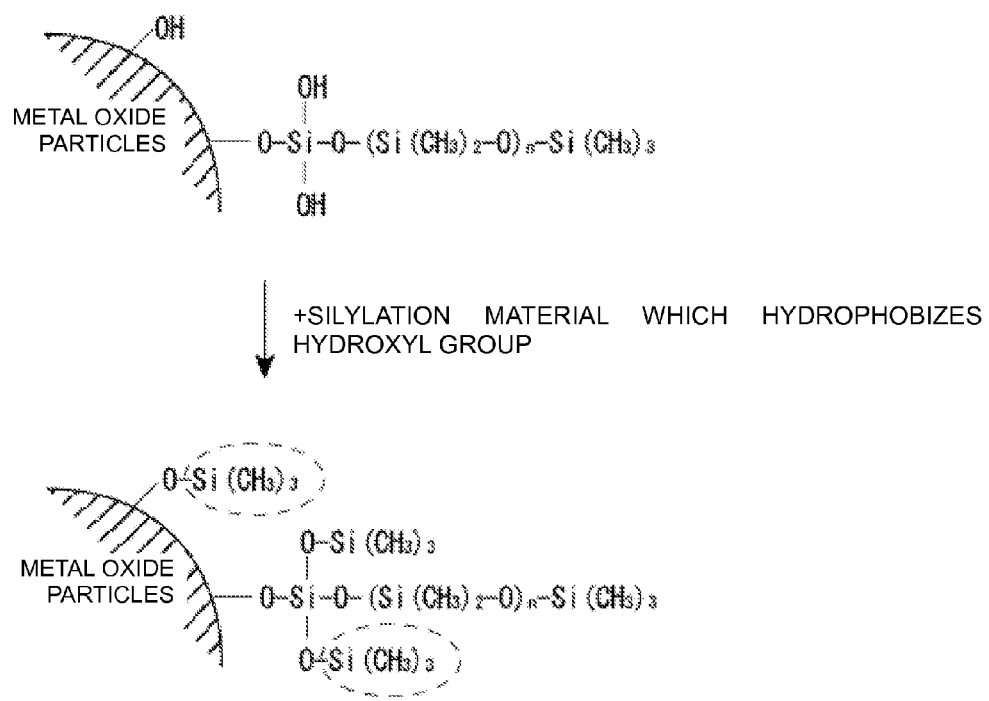
FIG. 3 is a scheme describing a change of a surface state in a case where a first surface modification is performed on metal oxide particles, and then a second surface modification is further performed with a silylation material which hydrophobizes a hydroxyl group.

As shown in FIG. 3, in the present invention, by further performing the second surface modification on the metal oxide particles (upper part in FIG. 3) to which the first surface modification is performed with the surface-modifying material including the specific silicone compound, hydroxyl groups (surface hydroxyl groups) on the surface which are not bonded to a first surface-modifying material on the surface of the metal oxide particles and hydroxyl groups which are not bonded to the surface of the metal oxide particles in the silicone compound modified material are silylation-treated (lower part in FIG. 3). By this, the viscosity becomes 100 Pa·s or less, the treated metal oxide particles can be handled in the same manner as the versatile silicone composition (matrix resin) used as a sealing material of an LED or the like, and mixing and dispersing into various resins can also become easy.

The total mixing amount of the surface-modifying material (surface-modifying material according to the first surface modification) including the specific silicone compound and the silylation material is preferably 50 parts by mass to 150 parts by mass, and more preferably 70 parts by mass to 100 parts by mass with respect to 100 parts by mass of the metal oxide particles. When the total mixing amount is less than 50 parts by mass, the viscosity of the silicone surface-modified-metal-oxide-particle material is increased, and when the total mixing amount is greater than 150 parts by mass, excessive modifying material which has not reacted with the particles is intertwined with the modifying material which has reacted with the particles, and thus, the viscosity is increased. In addition, since the modifying material is excessive, the content of the metal oxide particles is lowered, and thus, for example, characteristics as the metal oxide particles such as the refractive index can not be sufficiently drawn out.

As the silylation material, the followings can be exemplified, and a material which has a little number of carbon atoms and does not have decomposed production of chlorine is preferable in terms of heat resistance. The amount of the silylation material can be conveniently determined according to the type and particle diameter of the metal oxide particles, the amount of the silicone compound surface-modifying material, and the reaction efficiency with the metal oxide particle surface, and the amount is preferably 1 part by mass to 100 parts by mass, and more preferably 5 parts by mass to 50 parts by mass with respect to 100 parts by mass of the metal oxide particles.

$(CH_3)_3SiCl$ [trimethylsilyl chloride]
$(CH_3)_3SiNHSi(CH_3)_3$ [hexamethyl disilazane]
$(CH_3)_3SiNHCONHSi(CH_3)_3$ [N,N'-bis(trimethylsilyl)urea]
$(C_2H_5)_3SiCl$ [triethylsilyl chloride]
tert-$Bu(CH_3)_2SiCl$ [t-butyldimethylsilyl chloride]
i-$Pr_3SiCl$ [tri-i-propylsilyl chloride]
$Cl(i-Pr)_2SiOSi(i-Pr)_2Cl$ [1,3-dichloro-1,1,3,3-tetra-tri-i-propyldisiloxane]
$ClCH_2Si(CH_3)_3$ [chloromethyltrimethylsilane]
$(CH_3)_3SiOCH_3$ [trimethylmonomethoxysilane]

As the silylation method by the silylation material, a method in which the silylation material is brought into contact with the metal oxide particles on which the first surface modification is performed by the wet method or the dry method can be exemplified, and to effectively react the hydrolyzed silylation material with surface hydroxyl groups which are not bonded to the first surface-modifying material on the surface of the metal oxide particles or hydroxyl groups which are not bonded to the metal oxide particle surface in the silicone compound modified material, the reaction is preferably performed by dispersing the metal oxide particles on which the first surface modification is performed into an organic solvent and adding the silylation material thereto.

In the present invention, in a case of increasing the refractive index of the composite composition, the refractive index of the surface-modified-metal-oxide-particle material is preferably 1.48 or higher, more preferably 1.55 or higher, and further more preferably 1.60 or higher. When the refractive index is less than 1.48, there is a case where it is not possible to improve the refractive index even when being combined with the versatile silicone composition (matrix resin) used as an LED sealing material, and there is a case where it is not possible to improve the refractive index compared to a case where the versatile silicone composition is sealed on an LED element even when coating the LED element with a silicone surface-modified high refractive index metal oxide particle material.

In addition, the viscosity of the surface-modified-metal-oxide-particle material of the present invention at 25° C. is 1000 Pa·s or less, preferably 900 Pa·s or less, more preferably 850 Pa·s or less, and further more preferably 100 Pa·s or less. When the viscosity at 25° C. is 1000 Pa·s or less, the surface-modified-metal-oxide-particle material can be handled in the same manner as the versatile silicone composition (matrix resin) used as an LED sealing material or the like, and mixing and dispersing into the silicone compound (matrix resin) can also become easy. That is, since the surface-modified-metal-oxide-particle material itself has low viscosity, when being mixed with the silicone composition (matrix resin), only a small amount of an organic solvent required to adjust the viscosity is used, or an organic solvent is not used in some cases. In particular, when the viscosity is 100 Pa·s or less, an organic solvent required to adjust the viscosity is not necessary. On the other hand, when the viscosity is greater than 1000 Pa·s, when being mixed with the silicone composition (matrix resin), the viscosity is required to be reduced using a large amount of organic solvent, and process load for removing solvent is increased in an application process.

The transmittance of light of the surface-modified-metal-oxide-particle material of the present invention at a wavelength of 400 nm to 800 nm and a thickness of 1 mm is 60% or greater, preferably 70% or greater, and more preferably 80% or greater. When the transmittance is less than 60%, it is not possible to maintain high transparency when mixing and dispersing into the silicone composition (matrix resin).

Here, the transmittance of light at the "thickness of 1 mm", for example, may be obtained as follows. That is, after an optical path length of the surface-modified-metal-oxide-particle material is made to be 1 mm by filling the surface-modified-metal-oxide-particle material in a quartz cell having an inner width of 1 mm, the transmittance is measured, the transmittance is compared and contrasted to a value measured from an empty quartz cell, and by this, the transmittance of light at the "thickness of 1 mm" is calculated.

As described above, according to the surface-modified-metal-oxide-particle material of the present invention, in a state in which a solvent is not used, or the use of solvent is suppressed to the utmost, the surface-modified-metal-oxide-particle material can be homogeneously transparently mixed and dispersed with ease into an addition type or a condensation type silicone composition described below, and it is possible to improve optical characteristics such as the refractive index, mechanical characteristics, thermal conductivity characteristics, and characteristics such as a gas permeation resistance of the addition type or the condensation type silicone composition. Thus, it is possible to increase the refractive index of a part adjacent to the optical semiconductor element. Furthermore, by laminating known compositions for sealing optical semiconductor element thereon, it is possible to achieve an optical semiconductor device in which the refractive index is sloped toward an air interface from the optical semiconductor element.

In addition, in the surface-modified-metal-oxide-particle material of the present invention, a phosphor (for example, a YAG phosphor for blue InGaN, or a RGB phosphor for ultraviolet rays) may be contained. Thus, it is possible to dispose a phosphor at a part having high refractive index adjacent to the optical semiconductor element.

[2] Composition for Sealing Optical Semiconductor Element

The composition for sealing optical semiconductor element of the present invention contains the surface-modified-metal-oxide-particle material of the present invention.

Other than the surface-modified-metal-oxide-particle material, various silicone resins (matrix resins) are preferably contained, and as the silicone resins, a methyl silicone, a methyl phenyl silicone, a phenyl silicone, and modified silicone can be exemplified. According to the curing method, an addition curing type silicone composition and a condensation curing type silicone composition can be exemplified.

The addition curing type silicone composition is a composition containing at least an alkenyl group-containing silicone, a hydrogen silicone, and a platinum group metal-based catalyst.

The condensation curing type silicone composition is a composition containing a silicone of which at least a molecular chain terminal is blocked with a hydroxyl group or a hydrolyzable group, a silane compound containing three or more hydrolyzable groups bonded to a silicon atom in one molecule, and a condensation catalyst containing an aminoxy group, an amino group, and a ketoxime group.

[3] Optical Semiconductor Device

In the optical semiconductor device of the present invention, optical semiconductor elements are sealed by a sealing material layer of at least one layer, and a first sealing material layer in contact with the optical semiconductor elements contains the composition for sealing optical semiconductor element of the present invention. The sealing material layer may be constituted with only the first sealing material layer (first aspect), and may be constituted with two or more sealing material layers in which a layer in contact with the optical semiconductor element is the first sealing material layer (second aspect).

The light emitting device of the optical semiconductor device will be described in detail with reference to examples. Moreover, the present invention is not particularly limited to the examples.

As shown in FIG. 1, in a first aspect (light emitting device 10) according to the present invention, a light emitting element 14 is disposed at a recessed part 12A of a reflection cup 12, and a first sealing material layer 16 formed of the sealing material of the present invention is formed so as to bury the recessed part in contact with the light emitting element 14.

According to the device, the light emitted from the light emitting element 14 passes through a boundary surface of the light emitting element 14 and the sealing material, passes through the sealing material, and is directly taken out, or is taken out by reflection by the wall of the reflection cup 12.

As the light emitting element constituting the light emitting device, a light emitting diode (LED) and semiconductor laser can be exemplified. Here, as the light emitting diode, a red light emitting diode which emits red light (for example, light having a wavelength of 640 nm), a green light emitting diode which emits green light (for example, light having a wavelength of 530 nm), and a blue light emitting diode which emits blue light (for example, light having a wavelength of 450 nm) can be exemplified. The light emitting diode may have so called a face up structure, or may have a flip-chip structure. That is, the light emitting diode is constituted with a substrate and a light emitting layer formed on the substrate, and may have a structure in which light is emitted to the outside from the light emitting layer, or may have a structure in which light from the light emitting layer is emitted to the outside through the substrate.

More specifically, for example, the light emitting diode (LED) has a structure in which a first cladding layer composed of a compound semiconductor layer having a first conductivity type (for example, n-type) formed on a substrate, an active layer formed on the first cladding layer, and a second cladding layer composed of a compound semiconductor layer having a second conductivity type (for example, p-type) formed on the active layer are laminated, and is provided with a first electrode which is electrically connected to the first cladding layer and a second electrode which is electrically connected to the second cladding layer. The layer constituting the light emitting diode may be constituted with known compound semiconductor materials depending on an emission wavelength.

Figure 2:
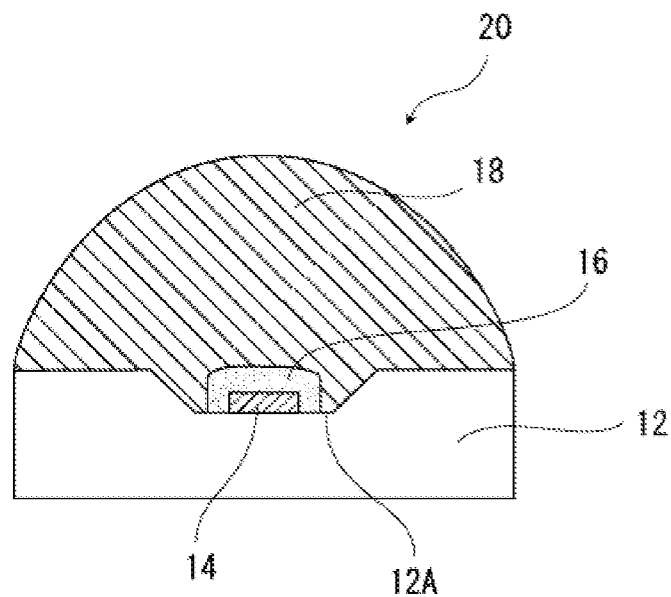
FIG. 2 is a cross-sectional view schematically showing another embodiment of the optical semiconductor device of the present invention.

As shown in FIG. 2, a second aspect (light emitting device 20) of the present invention is the same as the first aspect except that the first sealing material layer is formed so as to cover the surface of the light emitting element 14, and at the outer side thereof, a second sealing material layer 18 having a composition different from the composition for sealing optical semiconductor element of the present invention is formed.

As the material of the second sealing material layer having a different composition ratio, resins or resin compositions such as methyl silicone, methyl phenyl silicone, phenyl silicone, modified silicone, acrylic resin, an epoxy resin, and a polyimide resin can be exemplified. The refractive index of the second sealing material layer is preferably equal to or less than the refractive index of the first sealing material layer to further reduce the interface reflection of the first sealing material layer and the second sealing material layer. In addition, the surface-modified-metal-oxide-particles of the present invention may also be contained for the purpose of adjusting the refractive index of the second sealing material layer.

In addition, the optical semiconductor device of the present invention can be an optical semiconductor device in which a light emitting element and a phosphor are combined. According to the optical semiconductor device of the present invention, the first sealing material layer in contact with the optical semiconductor element contains the composition for sealing optical semiconductor element of the present invention described above, and the phosphor described above (for example, a YAG phosphor for blue InGaN, or a RGB phosphor for ultraviolet rays) may be contained in the first sealing material layer. As the phosphor, a phosphor contained in the surface-modified-metal-oxide-particle material of the present invention in advance may be used, and a phosphor mixed in various silicones (matrix resin) may be used by being mixed with the surface-modified-metal-oxide-particle material of the present invention.

In particular, in consideration of a case of reducing the used amount of the phosphor in view of the cost or a case of improving the light conversion efficiency by centrally disposing the phosphor near the light emitting element, the phosphor is preferably contained in the first sealing material layer in the second aspect. The phosphor is preferably 5% by mass to 80% by mass, and more preferably 20% by mass to 70% by mass with respect to the mass of the first sealing material layer. Moreover, the phosphor can also be contained in the second sealing material layer.

As such an optical semiconductor device in which a light emitting element and a phosphor are combined, a white light emitting diode (for example, a light emitting diode which emits white light by combining ultraviolet rays or a blue light emitting diode and phosphor particles) can be exemplified.

EXAMPLES

Hereinafter, the present invention will be described in more detail based on examples and comparative examples, but the present invention is not limited to these examples.

[A] First Example (Manufacture of Metal Oxide Particles)

(1) Zirconium Oxide Particle 1-A

While stirring a zirconium salt solution in which 261.5 g of zirconium oxychloride octahydrate was dissolved in 4 L (liters) of pure water, diluted ammonia water in which 34.4 g of 28% ammonia water was dissolved in 2 L of pure water was added dropwise thereto, whereby zirconia precursor slurry was prepared.

Next, a sodium sulfate aqueous solution in which 30 g of sodium sulfate was dissolved in 0.5 L of pure water was added to this slurry while stirring. The added amount of sodium sulfate at this time was 30% by mass with respect to a zirconia conversion value of zirconium ions in the zirconium salt solution. Next, this mixture was filtered, the water of the obtained cake was removed by drying, and the cake was baked at 500° C. for 1 hour in the atmospheric air using an electric furnace, whereby a baked material was obtained.

This baked material was put into pure water, after the mixture was stirred to make into a slurry form, cleaning was performed using a centrifugal separator, and the added sodium sulfate was sufficiently removed, followed by drying with a dryer, whereby a zirconium oxide particle 1-A was obtained.

The average primary particle diameter of the obtained zirconium oxide particle 1-A was obtained using a Scherrer's formula by X-ray diffraction, and the average primary particle diameter of 1-A was 4 nm.

In addition, a refractive index of the zirconium oxide particle 1-A was obtained in the following manner.

By adjusting a pH of water, the zirconium oxide particle 1-A was dispersed in the water, whereby an aqueous dispersion of the zirconium oxide particle 1-A was obtained. In the same manner, four aqueous dispersions of which solid content concentrations of the zirconium oxide particle 1-A are different were prepared, and the refractive index of each of the aqueous dispersions was measured using an Abbe's refractometer. The measured refractive indexes were extrapolated, whereby the refractive index of the zirconium oxide particle 1-A was obtained.

(2) Zirconium Oxide Particle 1-B

A zirconium oxide particle 1-B was manufactured in the same manner as in the zirconium oxide particle 1-A except that the temperature during baking in the atmospheric air using the electric furnace was 550° C.

The average primary particle diameter of the obtained zirconium oxide particle 1-B was 6 nm.

(3) Zirconium Oxide Particle 1-C

A zirconium oxide particle 1-C was manufactured in the same manner as in the zirconium oxide particle 1-A except that the temperature during baking in the atmospheric air using the electric furnace was 450° C.

The average primary particle diameter of the obtained zirconium oxide particle 1-C was 2 nm.

(4) Zirconium Oxide Particle 1-D

A zirconium oxide particle 1-D was manufactured in the same manner as in the zirconium oxide particle 1-A except that the temperature during baking in the atmospheric air using the electric furnace was 600° C.

The average primary particle diameter of the obtained zirconium oxide particle 1-D was 15 nm.

(5) Titanium Oxide Particle 1

242.1 g of titanium tetrachloride and 111.9 g of tin (IV) chloride pentahydrate were put into 1.5 L (liters) of pure water at 5° C., and the mixture was stirred, whereby a mixed solution was manufactured.

Next, the temperature was adjusted to 25° C. by heating this mixed solution, the pH of the mixed solution was adjusted to 1.5 by adding an ammonium carbonate aqueous solution having a concentration of 10% by mass thereto, followed by aging at 25° C. for 24 hours, and excessive chloride ions were removed.

Next, water was removed from the mixed solution using an evaporator, followed by drying, whereby a titanium oxide particle 1 was manufactured.

The average primary particle diameter of the obtained titanium oxide particle 1 was 4 nm.

(6) Zinc Oxide Particle 1

161.5 g of zinc sulfate was put into 3 L (liters) of pure water at 5° C., whereby a zinc sulfate aqueous solution was obtained.

Next, while stirring this aqueous solution, diluted ammonia water adjusted to 5° C. in which 8.6 g of 28% ammonia water was dissolved in 2 L of pure water was added dropwise thereto, whereby translucent slurry was manufactured.

Next, the slurry was subjected to a centrifugation treatment with a centrifugal separator to collect the solid material thereof. The collected solid material was freeze-dried, whereby a zinc oxide particle 1 was obtained.

The average primary particle diameter of the obtained zinc oxide particle 1 was 4 nm.

(7) Silica Particle 1

Silica particles of SNOWTEX OXS manufactured by Nissan Chemical Industries, Ltd. were used. The average primary particle diameter of the silica particles was 5 nm.

(Preparation of Modifying Material)

Modifying materials 1-A to 1-F were prepared in the following manner.

An outline of a synthesis flow in a case where one terminal includes a vinyl group is described below.

In addition, synthetic methods in a case where one terminal includes a vinyl group and one terminal includes a trimethyl group are further described below, and the mixing amount of material applied to each of the modifying materials is described.

[Chem. 5]

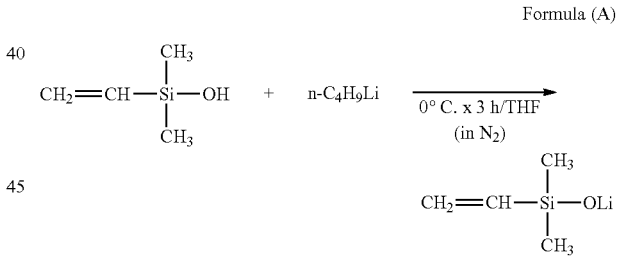

Formula (A)

[Chem. 6]

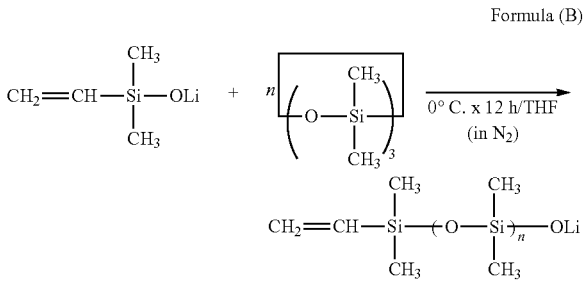

Formula (B)

[Chem. 7]

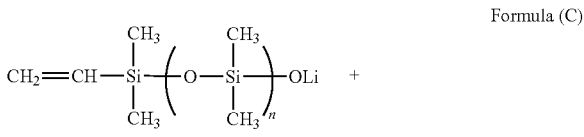

Formula (C)

-continued

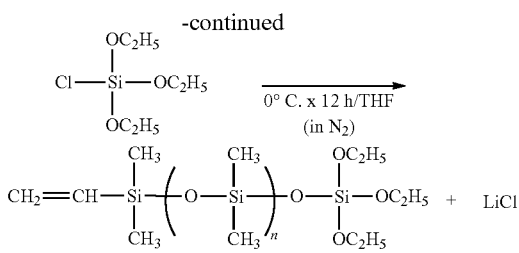

In a case where one terminal includes a vinyl group, dimethyl vinyl silanol was dissolved and in a case where one terminal includes a trimethyl group, trimethyl silanol was dissolved in tetrahydrofuran (THF) solvent in a nitrogen atmosphere, n-butyl lithium dissolved in n-hexane at a temperature of 0° C. was added dropwise thereto while stirring, and the mixture was allowed to react for 3 hours, whereby lithium dimethyl vinyl silanolate (in a case where one terminal includes a vinyl group) and lithium trimethyl silanolate (in a case where one terminal includes a trimethyl group) were obtained (refer to the formula (A)).

Next, hexamethyl cyclosiloxane dissolved in a THF solvent in which the amount of the formula (1) becomes a desired degree of polymerization was added dropwise thereto, and the mixture was allowed to react at a temperature of 0° C. for 12 hours, whereby lithium dimethyl organosilanolate (in a case where one terminal includes a vinyl group) and lithium trimethyl organosilanolate (in a case where one terminal includes a trimethyl group) were obtained (refer to the formula (B)).

Next, chlorotriethoxysilane was added thereto, and the mixture was allowed to react at a temperature of 0° C. for 12 hours (refer to the formula (C)).

Next, n-hexane was mixed to form a precipitate of lithium chloride, and the lithium chloride was filtered and removed, whereby a modifying material of the formula (1) was obtained.

The structure of the obtained modifying material was confirmed using a 1H-NMR.

(1) Modifying material 1-A: Preparation of $(CH_2\!=\!CH)(CH_3)_2SiO(SiO(CH_3)_2)_{60}Si(OC_2H_5)_3$ A modifying material 1-A was synthesized at the following material ratio according to the above.
Dimethyl vinyl silanol 4.6 g
THF 150 ml (milliliters)
n-Butyl lithium 2.9 g
Hexamethyl cyclosiloxane 200.3 g
Chlorotriethoxysilane 8.9 g (2) Modifying material 1-B: Preparation of $(CH_3)_3SiO(SiO(CH_3)_2)_{60}Si(OC_2H_5)_3$ A modifying material 1-B was synthesized at the following material ratio according to the above.
Trimethyl silanol 4.0 g
THF 150 ml (milliliters)
n-Butyl lithium 2.9 g
Hexamethyl cyclosiloxane 200.3 g
Chlorotriethoxysilane 8.9 g (3) Modifying material 1-C: Preparation of $(CH_2\!=\!CH)(CH_3)_2SiO(SiO(CH_3)_2)_{30}Si(OC_2H_5)_3$ A modifying material 1-C was synthesized at the following material ratio according to the above.
Dimethyl vinyl silanol 9.2 g
THF 300 ml (milliliters)
n-Butyl lithium 5.8 g
Hexamethyl cyclosiloxane 200.3 g
Chlorotriethoxysilane 17.9 g (4) Modifying material 1-D: Preparation of $(CH_2\!=\!CH)(CH_3)_2SiO(SiO(CH_3)_2)_{45}Si(OC_2H_5)_3$ A modifying material 1-D was synthesized at the following material ratio according to the above.
Dimethyl vinyl silanol 9.2 g
THF 300 ml (milliliters)
n-Butyl lithium 5.8 g
Hexamethyl cyclosiloxane 300.4 g
Chlorotriethoxysilane 17.9 g (5) Modifying material 1-E: Preparation of $(CH_2\!=\!CH)(CH_3)_2SiO(SiO(CH_3)_2)_3Si(OC_2H_5)_3$ A modifying material 1-E was synthesized at the following material ratio according to the above.
Dimethyl vinyl silanol 45.9 g
THF 1500 ml (milliliters)
n-Butyl lithium 28.8 g
Hexamethyl cyclosiloxane 100.1 g
Chlorotriethoxysilane 89.4 g (6) Modifying material 1-F: Preparation of $(CH_2\!=\!CH)(CH_3)_2SiO(SiO(CH_3)_2)_{150}Si(OC_2H_5)_3$ A modifying material 1-F was synthesized at the following material ratio according to the above.
Dimethyl vinyl silanol 1.8 g
THF 60 ml (milliliters)
n-Butyl lithium 1.2 g
Hexamethyl cyclosiloxane 200.3 g
Chlorotriethoxysilane 3.6 g (Manufacture and Evaluation of Modified Particles)

Example 1-1

After 10 g of the modifying material 1-A was dissolved in 80 g of toluene, 10 g of the zirconium oxide particle 1-A was put thereinto. Next, 100 g of glass beads having a diameter of 0.1 mm in which 5 g of acetic acid aqueous solution of 10% by mass was impregnated was put thereinto, and after treating this liquid mixture with a sand grinder for 3 hours, the collected slurry was stirring-treated at 100° C. for 10 hours. After filtering the obtained dispersion, toluene was removed by an evaporator, whereby modified particles of Example 1-1 were obtained (surface-modified-metal-oxide-particle material).

Example 1-2

After 4.5 g of the modifying material 1-A was dissolved in 80 g of toluene, 10 g of the zirconium oxide particle 1-B was put thereinto, and modified particles of Example 1-2 were obtained in the same manner as in Example 1-1.

Example 1-3

After 10 g of the modifying material 1-B was dissolved in 80 g of toluene, 10 g of the zirconium oxide particle 1-A was put thereinto, and modified particles of Example 1-3 were obtained in the same manner as in Example 1-1.

Example 1-4

After 5 g of the modifying material 1-C was dissolved in 80 g of toluene, 10 g of the zirconium oxide particle 1-A was put thereinto, and modified particles of Example 1-4 were obtained in the same manner as in Example 1-1.

Example 1-5

After 7.5 g of the modifying material 1-D was dissolved in 80 g of toluene, 10 g of the zirconium oxide particle 1-A was put thereinto, and modified particles of Example 1-5 were obtained in the same manner as in Example 1-1.

Example 1-6

After 13 g of the modifying material 1-A was dissolved in 80 g of toluene, 10 g of the titanium oxide particle 1 was put thereinto, and modified particles of Example 1-6 were obtained in the same manner as in Example 1-1.

Example 1-7

After 10 g of the modifying material 1-A was dissolved in 80 g of toluene, 10 g of the zinc oxide particle 1 was put thereinto, and modified particles of Example 1-7 were obtained in the same manner as in Example 1-1.

Comparative Example 1-1

After 20 g of the modifying material 1-A was dissolved in 80 g of toluene, 10 g of the zirconium oxide particle 1-C was put thereinto, and modified particles of Comparative Example 1-1 were obtained in the same manner as in Example 1-1.

Comparative Example 1-2

After 2.5 g of the modifying material 1-A was dissolved in 80 g of toluene, 10 g of the zirconium oxide particle 1-D was put thereinto, and modified particles of Comparative Example 1-2 were obtained in the same manner as in Example 1-1.

Comparative Example 1-3

After 10 g of the modifying material 1-E was dissolved in 80 g of toluene, 10 g of the zirconium oxide particle 1-A was put thereinto, and modified particles of Comparative Example 1-3 were obtained in the same manner as in Example 1-1.

Comparative Example 1-4

After 10 g of the modifying material 1-F was dissolved in 80 g of toluene, 10 g of the zirconium oxide particle 1-A was put thereinto, and modified particles of Comparative Example 1-4 were obtained in the same manner as in Example 1-1.

Reference Example 1-1

The concentration was adjusted such that SNOWTEX OXS manufactured by Nissan Chemical Industries, Ltd. which is a silica sol (dispersion medium: water) becomes 5% by mass in terms of silica particles. Next, a solution in which stearic acid was dissolved in methanol so as to be 5% by mass and the concentration-adjusted SNOWTEX OXS were mixed and stirred, and a precipitate was collected and dried. After 20 g of the dried powder was put into 80 g of toluene, 10 g of the modifying material 1-A was added thereto, and the mixture was stirring-treated at 100° C. for hours. After filtering the obtained dispersion, toluene was removed by an evaporator, whereby modified particles of Reference Example 1-1 were obtained.

(Evaluation of Surface-Modified-Metal-Oxide-Particle Material)

Various evaluations were performed on the surface-modified-metal-oxide-particle materials of Examples 1-1 to 1-7, Comparative Examples 1-1 to 1-4, and Reference Example 1-1 by the following device or method.

(1) Viscosity

The viscosity of the modified particles was measured using RheoStress RS-6000 (manufactured by Haake Technik) as a rheometer.

Moreover, the viscosity of the modified particles was measured at a shear rate of 1.0 (1/s) and 25° C. The measurement results are shown in the following Table 1.

(2) Transmittance

The modified particles were placed in a thin layer quartz cell having an optical path length of 1 mm, measurement was performed in a wavelength range of 350 nm to 800 nm using a spectrophotometer (V-570, manufactured by Jasco Corporation) with an integrating sphere.

Here, a value obtained by measuring only quartz cell (air) was set to a blank. The measurement results of transmittance at a wavelength of 400 nm are shown in the following Table 1.

Moreover, at wavelengths longer than 400 nm, values higher than the transmittance at 400 nm were obtained.

(3) Refractive Index

Refractive index was measured using an Abbe's refractometer based on Japanese Industrial Standard JIS K 7142 "Plastics-Determination of refractive index". The measurement results are shown in the following Table 1.

TABLE 1

| | | Metal oxide particles | | | Surface-modifying material | | | Surface-modifying material/ Metal oxide particles [volume ratio] | Evaluation result of surface-modified-metal-oxide-particle material | | |
|---|---|---|---|---|---|---|---|---|---|---|---|
| | | Type | Refractive index | Average primary particle diameter [nm] | Type | One terminal | Another terminal | Number corresponding to n in the formula (1) | | Viscosity [Pa·s] | Refractive index | Transmittance [%] |
| Example 1 | -1 | 1-A (ZrO$_2$) | 2.07 | 4 | 1-A | Vinyl group | Ethoxy group | 60 | 5.6 | 800 | 1.524 | 86 |
| | -2 | 1-B (ZrO$_2$) | 2.09 | 6 | 1-A | Vinyl group | Ethoxy group | 60 | 2.5 | 450 | 1.618 | 66 |
| | -3 | 1-A (ZrO$_2$) | 2.07 | 4 | 1-B | Methyl group | Ethoxy group | 60 | 5.6 | 810 | 1.524 | 86 |
| | -4 | 1-A (ZrO$_2$) | 2.07 | 4 | 1-C | Vinyl group | Ethoxy group | 30 | 2.8 | 960 | 1.605 | 83 |

TABLE 1-continued

| | | Metal oxide particles | | Surface-modifying material | | | Surface-modifying material/ Metal oxide particles [volume ratio] | Evaluation result of surface-modified-metal-oxide-particle material | | |
|---|---|---|---|---|---|---|---|---|---|---|
| | | Type | Refractive index | Average primary particle diameter [nm] | Type | One terminal | Another terminal | Number corresponding to n in the formula (1) | | Viscosity [Pa·s] | Refractive index | Transmittance [%] |

| | | Type | Refractive index | Avg. diameter [nm] | Type | One terminal | Another terminal | n | vol ratio | Viscosity [Pa·s] | Refractive index | Transmittance [%] |
|---|---|---|---|---|---|---|---|---|---|---|---|---|
| | -5 | 1-A (ZrO$_2$) | 2.07 | 4 | 1-D | Vinyl group | Ethoxy group | 45 | 4.2 | 910 | 1.554 | 84 |
| | -6 | TiO$_2$ | 2.64 | 4 | 1-A | Vinyl group | Ethoxy group | 60 | 4.3 | 820 | 1.668 | 78 |
| | -7 | ZnO | 1.89 | 4 | 1-A | Vinyl group | Ethoxy group | 60 | 5.6 | 810 | 1.495 | 88 |
| Comparative Example 1 | -1 | 1-C (ZrO$_2$) | 2.03 | 2 | 1-A | Vinyl group | Ethoxy group | 60 | 11.2 | 4500 | 1.472 | 90 |
| | -2 | 1-D (ZrO$_2$) | 2.10 | 15 | 1-A | Vinyl group | Ethoxy group | 60 | 1.4 | 990 | 1.706 | 0 |
| | -3 | 1-A (ZrO$_2$) | 2.07 | 4 | 1-E | Vinyl group | Ethoxy group | 3 | 5.6 | >10000 | 1.524 | Measurement is impossible (transparent) |
| | -4 | 1-A (ZrO$_2$) | 2.07 | 4 | 1-F | Vinyl group | Ethoxy group | 150 | 5.6 | >10000 | 1.524 | Measurement is impossible (transparent) |
| Reference Example | -1 | SiO$_2$) | 1.46 | 5 | 1-A | Vinyl group | Ethoxy group | 60 | 2.4 | 750 | 1.422 | 90 |

In the surface-modified-metal-oxide-particle materials in Examples 1-1 to 1-7, since the surface-modified-metal-oxide-particles were formed by performing a surface modification on metal oxide particles having the average primary particle diameter of 3 nm to 10 nm and the refractive index of 1.7 or higher with a surface-modifying material including a silicone compound represented by the formula (1) described above and a volume ratio (surface-modifying material/metal oxide particles) of the surface-modifying material was 1.5 to 9, the refractive index was 1.48 or higher, the viscosity at 25° C. was 1000 Pa·s or less, and the transmittance of light at a wavelength of 400 nm to 800 nm and a thickness of 1 mm was 60% or greater.

On the other hand, in the surface-modified-metal-oxide-particle material in Comparative Example 1-1, since the average primary particle diameter of the metal oxide particles was excessively small, the viscosity is high, and since the volume ratio of the surface-modifying material was also excessively high, the refractive index also did not reach the desired value. On the other hand, in the surface-modified-metal-oxide-particle material in Comparative Example 1-2, since the average primary particle diameter of the metal oxide particles was excessively large and the volume ratio of the surface-modifying material was also excessively low, the transmittance of light was reduced. In the surface-modified-metal-oxide-particle material in Comparative Example 1-3, interaction among particles occurred since the silicone chain of the silicone compound represented by the formula (1) described above was excessively short, and on the other hand, in the surface-modified-metal-oxide-particle material in Comparative Example 1-4, the silicone chain of the silicone compound represented by the formula (1) described above was excessively long, and thus, the viscosities of both materials were high.

In addition, in the surface-modified-metal-oxide-particle material in Reference Example 1-1, there was no problem in the viscosity and the transmittance, and since silica having a low refractive index as the metal oxide particles was used, the refractive index was low.

(Manufacture and Evaluation of Composition for Sealing Optical Semiconductor Element and Optical Semiconductor Device)

Example 1-8

10 g of the modified particles of Example 1-1, 10 g of a methyl silicone resin (which is formed by mixing A liquid and B liquid of OE-6351 manufactured by Dow Corning Toray Co., Ltd. at a mass ratio of 1:1) as a sealing material, and 0.5 g of toluene were mixed using a commercially available rotation-revolution mixer (AR-100 manufactured by THINKY), whereby a composition for sealing optical semiconductor element of Example 1-8 (surface-modified-metal-oxide-particle material-containing composition for sealing optical semiconductor element) was manufactured.

There was no problem at all in mixing during manufacture of the composition for sealing optical semiconductor element, and a homogeneous mixed composition of the modified particles and the methyl silicone resin was obtained. The viscosity of the obtained mixed composition at 25° C. was 80 Pa·s, and the transmittance of light at a wavelength of 400 nm to 800 nm and a thickness of 1 mm was 82%.

Next, 10 g of the modified particles of Example 1-1, 10 g of a methyl silicone resin (which is formed by mixing A liquid and B liquid of OE-6351 manufactured by Dow Corning Toray Co., Ltd. at a mass ratio of 1:1) as a sealing material, 2 g of a phosphor (GLD(Y)-550A manufactured by GeneLite Inc.), and 0.5 g of toluene were mixed using a commercially available rotation-revolution mixer (AR-100 manufactured by THINKY), whereby a composition for sealing optical semiconductor element containing a phosphor of Example 1-8 (surface-modified-metal-oxide-particle material-containing composition for sealing optical semiconductor element) was manufactured.

There was no problem at all in mixing during manufacture, and a homogeneous mixed composition of the modified particles, the methyl silicone resin, and the phosphor was obtained.

The obtained composition for sealing optical semiconductor element containing a phosphor of Example 1-8 was injected into a package provided with commercially available optical semiconductor elements using a dispenser, and toluene was removed by drying for 2 hours at 10 hPa in a vacuum dryer which was set to 50° C. Next, the composition for sealing optical semiconductor element was cured by performing a heat-treatment at 150° C. for 1 hour, whereby an optical semiconductor device of Example 1-8 was obtained.

The injection work of the composition for sealing optical semiconductor element containing a phosphor of Example 1-8 could be performed in the same manner as in a case of a methyl silicone resin simple substance which does not include the modified particles, and there was no problem with the injection. In addition, during curing, since the amount of organic solvent in the composition for sealing optical semiconductor element is small, solvent removal could also be performed by a simple process, and therefore, an optical semiconductor device could be manufactured without any problem. In addition, it could be confirmed that the luminance of the obtained optical semiconductor device was improved compared to the case in which only the methyl silicone resin and phosphor were used as a sealing material.

Example 1-9

10 g of the modified particles of Example 1-2, and 10 g of a methyl silicone resin (which is formed by mixing A liquid and B liquid of OE-6351 manufactured by Dow Corning Toray Co., Ltd. at a mass ratio of 1:1) as a sealing material were mixed using a commercially available rotation-revolution mixer (AR-100 manufactured by THINKY), whereby a composition for sealing optical semiconductor element of Example 1-9 (surface-modified-metal-oxide-particle material-containing composition for sealing optical semiconductor element) was manufactured.

There was no problem at all in mixing during manufacture of the composition for sealing optical semiconductor element, and a homogeneous mixed composition of the modified particles and the methyl silicone resin was obtained. The viscosity of the obtained mixed composition at 25° C. was 75 Pa·s, and the transmittance of light at a wavelength of 400 nm to 800 nm and a thickness of 1 mm was 61%.

Next, 10 g of the modified particles of Example 1-2, 10 g of a methyl silicone resin (which is formed by mixing A liquid and B liquid of OE-6351 manufactured by Dow Corning Toray Co., Ltd. at a mass ratio of 1:1) as a sealing material, and 2 g of a phosphor (GLD(Y)-550A manufactured by GeneLite Inc.) were mixed using a commercially available rotation-revolution mixer (AR-100 manufactured by THINKY), whereby a composition for sealing optical semiconductor element containing a phosphor of Example 1-9 (surface-modified-metal-oxide-particle material-containing composition for sealing optical semiconductor element) was manufactured.

There was no problem at all in mixing during manufacture, and a homogeneous mixed composition of the modified particles, the methyl silicone resin, and the phosphor was obtained.

The obtained composition for sealing optical semiconductor element containing a phosphor of Example 1-9 was injected into a package provided with commercially available optical semiconductor elements using a dispenser. Next, the composition for sealing optical semiconductor element was cured by performing a heat-treatment at 150° C. for 1 hour, whereby an optical semiconductor device of Example 1-9 was obtained.

The injection work of the composition for sealing optical semiconductor element containing a phosphor of Example 1-9 could be performed in the same manner as in a case of a methyl silicone resin simple substance which does not include the modified particles, and there was no problem with the injection. In addition, since an organic solvent was not included in the composition for sealing optical semiconductor, solvent removal during curing was not necessary, and a curing process could be performed in the same manner as in the resin simple substance, and therefore, an optical semiconductor device could be manufactured without any problem. In addition, it could be confirmed that the luminance of the obtained optical semiconductor device was improved compared to the case in which only the methyl silicone resin and phosphor were used as a sealing material.

Comparative Example 1-5

10 g of the modified particles of Comparative Example 1-3, 10 g of a methyl silicone resin (which is formed by mixing A liquid and B liquid of OE-6351 manufactured by Dow Corning Toray Co., Ltd. at a mass ratio of 1:1) as a sealing material, 2 g of a phosphor (GLD(Y)-550A manufactured by GeneLite Inc.), and 0.5 g of toluene were mixed using a commercially available rotation-revolution mixer (AR-100 manufactured by THINKY), whereby a composition for sealing optical semiconductor element of Comparative Example 1-5 (surface-modified-metal-oxide-particle material-containing composition for sealing optical semiconductor element) was manufactured.

The composition for sealing optical semiconductor element after mixing was in a state in which massive modified particles and massive phosphor were dispersed in the methyl silicone resin, and it was not possible to obtain a homogeneous mixed composition. It is considered that this was because the viscosity of the modified particles of Comparative Example 1-1 was excessively high, and thus, sufficiently mixing was not possible.

Moreover, since a homogeneous mixed composition could not be obtained, manufacture of an optical semiconductor device was not performed.

Comparative Example 1-6

10 g of the modified particles of Comparative Example 1-1, 10 g of a methyl silicone resin (which is formed by mixing A liquid and B liquid of OE-6351 manufactured by Dow Corning Toray Co., Ltd. at a mass ratio of 1:1) as a sealing material, 2 g of a phosphor (GLD(Y)-550A manufactured by GeneLite Inc.), and 60 g of toluene were mixed using a commercially available rotation-revolution mixer (AR-100 manufactured by THINKY), whereby a composition for sealing optical semiconductor element containing a phosphor of Comparative Example 1-6 (surface-modified-metal-oxide-particle material-containing composition for sealing optical semiconductor element) was manufactured.

There was no problem in mixing during manufacture, and since the content of toluene is high, precipitation was found in a part of the phosphor.

The obtained composition for sealing optical semiconductor element of Comparative Example 1-6 was injected into a package provided with commercially available optical semiconductor elements using a dispenser, and toluene was removed by drying for 2 hours at 10 hPa in a vacuum dryer which was set to 50° C. After the mixed composition was filled in the package by repeating the injection and the removal by drying 5 times, the composition for sealing optical semiconductor element was cured by performing a heat-treatment at 150° C. for 1 hour, whereby an optical semiconductor device of Comparative Example 1-6 was obtained.

The injection work of the composition for sealing optical semiconductor element of Comparative Example 1-6 could be performed in the same manner as in a case of a methyl silicone resin simple substance which does not include the modified particles, and there was no problem with the injection. It is considered that this was because the viscosity was reduced by containing toluene which is an organic solvent. However, since a large amount of toluene was included, the volume was remarkably shrunk during drying, and therefore, if the injection and the removal by drying were not repeated 5 times, the mixed composition could not be filled in the package, and workability was greatly reduced.

Furthermore, since the mixed composition including a large amount of toluene was laminated, in particular, in a part close to the bottom of the package, bubbles which were considered to be caused by evaporation of the residual toluene occur, and by this, the luminance of the obtained optical semiconductor device was reduced compared to the case in which only the methyl silicone resin and phosphor were used as a sealing material. Moreover, it is considered that since the bubbles were present, transparency of the sealing material also was reduced.

[B] Second Example
(Manufacture of Metal Oxide Particles)
(1) Zirconium Oxide Particle 2-A While stirring a zirconium salt solution in which 261.5 g of zirconium oxychloride octahydrate was dissolved in 4 L (liters) of pure water, diluted ammonia water in which 34.4 g of 28% ammonia water was dissolved in 2 L of pure water was added dropwise thereto, whereby zirconia precursor slurry was prepared.

Next, a sodium sulfate aqueous solution in which 30 g of sodium sulfate was dissolved in 0.5 L of pure water was added to this slurry while stirring. The added amount of sodium sulfate at this time was 30% by mass with respect to a zirconia conversion value of zirconium ions in the zirconium salt solution.

Next, this mixture was filtered, the water of the obtained cake was removed by drying, and the cake was baked at 500° C. for 1 hour in the atmospheric air using an electric furnace.

Next, this baked material was put into pure water, after the mixture was stirred to make into a slurry form, cleaning was performed using a centrifugal separator, and the added sodium sulfate was sufficiently removed, followed by drying with a dryer, whereby a zirconium oxide particle 2-A was obtained.

The average primary particle diameter of the obtained zirconium oxide particle 2-A was obtained using a Scherrer's formula by X-ray diffraction, and the average primary particle diameter of the particle 2-A was 4 nm.

(2) Zirconium Oxide Particle 2-B

A zirconium oxide particle 2-B was manufactured in the same manner as in the zirconium oxide particle 2-A except that the temperature during baking in the atmospheric air using the electric furnace was 550° C.

The average primary particle diameter of the obtained zirconium oxide particle 2-B was 6 nm.

(3) Zirconium Oxide Particle 2-C

A zirconium oxide particle 2-C was manufactured in the same manner as in the zirconium oxide particle 2-A except that the temperature during baking in the atmospheric air using the electric furnace was 450° C.

The average primary particle diameter of the obtained zirconium oxide particle 2-C was 2 nm.

(4) Zirconium Oxide Particle 2-D

A zirconium oxide particle 2-D was manufactured in the same manner as in the zirconium oxide particle 2-A except that the temperature during baking in the atmospheric air using the electric furnace was 600° C.

The average primary particle diameter of the obtained zirconium oxide particle 2-D was 15 nm.

(5) Titanium Oxide Particle 2

242.1 g of titanium tetrachloride and 111.9 g of tin (IV) chloride pentahydrate were put into 1.5 L (liters) of pure water at 5° C., and the mixture was stirred, whereby a mixed solution was manufactured.

Next, the temperature was adjusted to 25° C. by heating this mixed solution, the pH of the mixed solution was adjusted to 1.5 by adding an ammonium carbonate aqueous solution having a concentration of 10% by mass thereto, followed by aging at 25° C. for 24 hours, and excessive chloride ions were removed. Next, water was removed from the mixed solution using an evaporator, followed by drying, whereby a titanium oxide particle 2 was manufactured.

The average primary particle diameter of the obtained titanium oxide particle 2 was 4 nm.

(6) Zinc Oxide Particle 2

161.5 g of zinc sulfate was put into 3 L (liters) of pure water at 5° C., whereby a zinc sulfate aqueous solution was obtained.

Next, while stirring this aqueous solution, diluted ammonia water adjusted to 5° C. in which 8.6 g of 28% ammonia water was dissolved in 2 L of pure water was added dropwise thereto, whereby translucent slurry was manufactured.

Next, the slurry was subjected to a centrifugation treatment with a centrifugal separator to collect the solid material thereof. The collected solid material was freeze-dried, whereby a zinc oxide particle 2 was obtained.

The average primary particle diameter of the obtained zinc oxide particle 2 was 4 nm.

(7) Silica Particle 2

Silica particles of SNOWTEX OXS manufactured by Nissan Chemical Industries, Ltd. were used. The average primary particle diameter of the silica particles was 5 nm.

(Preparation of Surface-Modifying Material Including Silicone Compound)

Modifying materials 2-A to 2-G were prepared in the following manner. An outline of a synthesis flow is described below. After that, the mixing amount of material applied to each of the modifying materials is described.

[Chem. 8]

Formula (D)

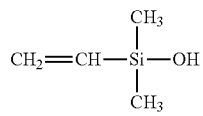

Dimethyl vinyl silanol (in case where one terminal is a vinyl group)

or

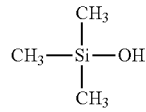

Trimethyl silanol (in a case where one terminal is a trimethyl group)

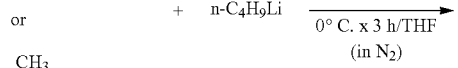

-continued

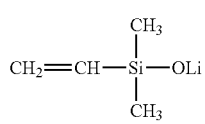

[Chem. 9]

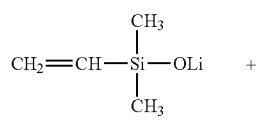 +

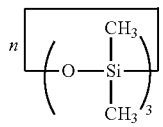

Hexamethyl cyclosiloxane
(in a case of a methyl
siloxane chain)

or

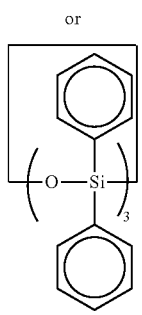

Hexaphenyl cyclosiloxane
(in a case of a phenyl
siloxane chain)

or

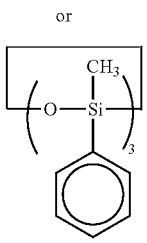

Triphenyl trimethyl cyclotrisiloxane
(in a case of a methyl phenyl
siloxane chain)

$\xrightarrow{0° C. \times 12 h/THF}$
(in N$_2$)

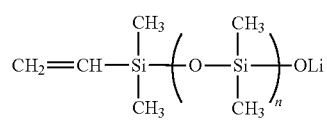

[Chem. 10]

Formula (F)

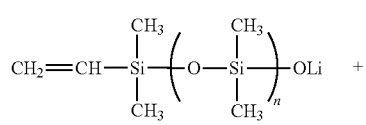 +

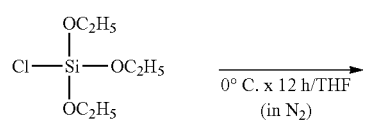

$\xrightarrow{0° C. \times 12 h/THF}$
(in N$_2$)

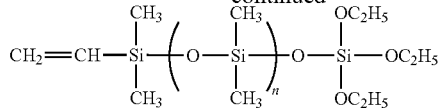

In a case of a methyl siloxane chain

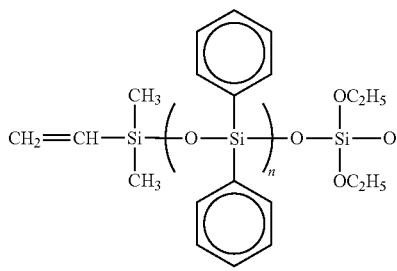 + LiCl

In a case of a phenyl siloxane chain

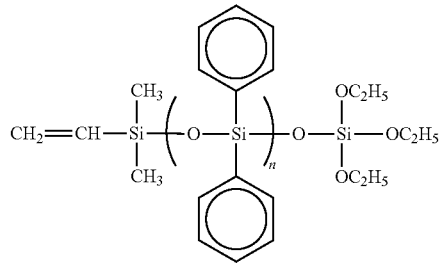

In a case of a methyl phenyl siloxane chain

In a case where one terminal includes a vinyl group, dimethyl vinyl silanol was dissolved and in a case where one terminal includes a trimethyl group, trimethyl silanol was dissolved in tetrahydrofuran (THF) solvent in a nitrogen atmosphere, n-butyl lithium dissolved in n-hexane at a temperature of 0° C. was added dropwise thereto while stirring, and the mixture was allowed to react for 3 hours, whereby lithium dimethyl vinyl silanolate (in a case where one terminal includes a vinyl group) and lithium trimethyl silanolate (in a case where one terminal includes a trimethyl group) were obtained (refer to the formula (D)).

Next, hexamethyl cyclosiloxane dissolved in a THF solvent (in a case of a phenyl siloxane chain, hexaphenyl cyclotrisiloxane, and in a case of a methyl phenyl siloxane chain, triphenyl trimethyl cyclotrisiloxane) of the amount in which n of the formula (1) becomes a desired degree of polymerization was added dropwise thereto, and the mixture was allowed to react at a temperature of 0° C. for 12 hours, whereby lithium dimethyl vinyl organosilanolate (in a case where one terminal includes a vinyl group) and lithium dimethyl organosilanolate (in a case where one terminal includes a trimethyl group) were obtained (refer to the formula (E)).

Next, chlorotriethoxysilane was added thereto, and the mixture was allowed to react at a temperature of 0° C. for 12 hours (refer to the formula (F)).

Next, n-hexane was mixed to form a precipitate of lithium chloride, and the lithium chloride was filtered and removed, whereby a modifying material of the formula (1) was obtained.

The structure of the obtained modifying material was confirmed using a 1H-NMR.

(1) Modifying material 2-A: Preparation of (CH$_2$=CH)(CH$_3$)$_2$SiO(SiO(CH$_3$)$_2$)$_{60}$Si(OC$_2$H$_5$)$_3$ A modifying material 2-A was synthesized at the following material ratio according to the above.

Dimethyl vinyl silanol 4.6 g
THF 150 ml (milliliters)
n-Butyl lithium 2.9 g
Hexamethyl cyclosiloxane 200.3 g
Chlorotriethoxysilane 8.9 g (2) Modifying material 2-B: Preparation of $(CH_2=CH)(CH_3)_2SiO(SiO(C_6H_5)_2)_{60}Si(OC_2H_5)_3$ A modifying material 2-B was synthesized at the following material ratio according to the above.
Dimethyl vinyl silanol 1.8 g
THF 60 ml (milliliters)
n-Butyl lithium 1.2 g
Hexaphenyl cyclotrisiloxane 213.9 g
Chlorotriethoxysilane 3.6 g (3) Modifying material 2-C: Preparation of $(CH_2=CH)(CH_3)_2SiO(SiO(C_6H_5)_2)_{45}Si(OC_2H_5)_3$ A modifying material 2-C was synthesized at the following material ratio according to the above.
Dimethyl vinyl silanol 1.8 g
THF 60 ml (milliliters)
n-Butyl lithium 1.2 g
Hexaphenyl cyclotrisiloxane 160.5 g
Chlorotriethoxysilane 3.6 g (4) Modifying material 2-D: Preparation of $(CH_3)_3SiO(SiC(CH_3)(C_6H_5))_{30}Si(OC_2H_5)_3$ A modifying material 2-D was synthesized at the following material ratio according to the above.
Trimethyl silanol 8.1 g
THF 300 ml (milliliters)
n-Butyl lithium 5.8 g
Triphenyl trimethyl cyclotrisiloxane 213.9 g
Chlorotriethoxysilane 17.9 g (5) Modifying material 2-E: Preparation of $(CH_3)_3SiO(SiO(CH_3)_2)_{60}Si(OC_2H_5)_3$ A modifying material 2-E was synthesized at the following material ratio according to the above.
Trimethyl silanol 4.1 g
THF 150 ml (milliliters)
n-Butyl lithium 2.9 g
Hexamethyl cyclosiloxane 200.3 g
Chlorotriethoxysilane 8.9 g (6) Modifying material 2-F: Preparation of $(CH_2=CH)(CH_3)_2SiO(SiO(CH_3)_2)_3Si(OC_2H_5)_3$ A modifying material 2-F was synthesized at the following material ratio according to the above.
Dimethyl vinyl silanol 45.9 g
THF 1500 ml (milliliters)
n-Butyl lithium 28.8 g
Hexamethyl cyclosiloxane 100.1 g
Chlorotriethoxysilane 89.4 g (7) Modifying material 2-G: Preparation of $(CH_2=CH)(CH_3)_2SiO(SiO(CH_3)_2)_{150}Si(OC_2H_5)_3$ A modifying material 2-G was synthesized at the following material ratio according to the above.
Dimethyl vinyl silanol 1.8 g
THF 60 ml (milliliters)
n-Butyl lithium 1.2 g
Hexamethyl cyclosiloxane 200.3 g
Chlorotriethoxysilane 3.6 g (Manufacture and Evaluation of Modified Particles)

Example 2-1

After 8.0 g of the modifying material 2-A was dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After cooling to room temperature, 20 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Example 2-1 were obtained.

Example 2-2

After 8.0 g of the modifying material 2-B was dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After cooling to room temperature, 20 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Example 2-2 were obtained.

Example 2-3

After 5.0 g of the modifying material 2-C was dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After cooling to room temperature, 20 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Example 2-3 were obtained.

Example 2-4

After 5.0 g of the modifying material 2-D was dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After cooling to room temperature, 20 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Example 2-4 were obtained.

Example 2-5

After 6.5 g of the modifying material 2-A was dissolved in 80.0 g of toluene, 10.0 g of the zirconium oxide particle 2-B was put thereinto. After treating this liquid mixture with a sand grinder for 3 hours, the collected slurry was stirring-treated at 100° C. for 10 hours. After cooling to room temperature, 15 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Example 2-5 were obtained.

Example 2-6

After 3.0 g of vinyltrimethoxysilane (KBM-1003 manufactured by Shin-Etsu Chemical Co., Ltd.) was dissolved in 80.0 g of toluene, 10.0 g of the zirconium oxide particle 2-A was put thereinto. After treating this liquid mixture with a sand grinder for 3 hours, 4.0 g of the modifying material 2-D was added thereto, and after further treating with a sand grinder for 3 hours, the collected slurry was stirring-treated at 100° C. for 10 hours. After cooling to room temperature, 15 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Example 2-6 were obtained.

Example 2-7

After 4.0 g of the modifying material 2-A and 4.0 g of the modifying material 2-E were dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After cooling to room temperature, 20 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Example 2-7 were obtained.

Example 2-8

After 8.0 g of the modifying material 2-B was dissolved in 80.0 g of toluene, 10.0 g of the titanium oxide particle 2 was put thereinto. After treating this liquid mixture with a sand grinder for 3 hours, the collected slurry was stirring-treated at 100° C. for 10 hours. After cooling to room temperature, 20 parts by mass of hexamethyl disilazane was added thereto with respect to 100 parts by mass of the titanium oxide particles, and the mixture was stirring-treated at 100° C. for 5 hours. After filtering the obtained dispersion, toluene was removed by an evaporator, whereby modified particles of Example 2-8 were obtained.

Example 2-9

After 8.0 g of the modifying material 2-B was dissolved in 80.0 g of toluene, 10.0 g of the zinc oxide particle 2 was put thereinto. After treating this liquid mixture with a sand grinder for 3 hours, the collected slurry was stirring-treated at 100° C. for 10 hours. After cooling to room temperature, 20 parts by mass of hexamethyl disilazane was added thereto with respect to 100 parts by mass of the zinc oxide particles, and the mixture was stirring-treated at 100° C. for 5 hours. After filtering the obtained dispersion, toluene was removed by an evaporator, whereby modified particles of Example 2-9 were obtained.

Example 2-10

The concentration was adjusted such that SNOWTEX OXS manufactured by Nissan Chemical Industries, Ltd. becomes 5% by mass in terms of silica particles. Next, a solution in which stearic acid was dissolved in methanol so as to be 5% by mass and the concentration-adjusted SNOWTEX OXS were mixed and stirred, and a precipitate was collected and dried. After 10.0 g of the dried powder was put into 80.0 g of toluene, 8.0 g of the modifying material A was added thereto, and the mixture was stirring-treated at 100° C. for 10 hours. After cooling to room temperature, 20 parts by mass of hexamethyl disilazane was added thereto with respect to 100 parts by mass of the zinc oxide particles, and the mixture was stirring-treated at 100° C. for 5 hours. After filtering the obtained dispersion, toluene was removed by an evaporator, whereby modified particles of Example 2-10 were obtained.

Reference Example 2-1

After 8.0 g of the modifying material 2-A was dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After filtering the obtained dispersion, toluene was removed by an evaporator, whereby modified particles of Reference Example 2-1 were obtained.

Comparative Example 2-1

After 10.0 g of the modifying material 2-A was dissolved in 80.0 g of toluene, 10.0 g of the zirconium oxide particle 2-C was put thereinto. After treating this liquid mixture with a sand grinder for 3 hours, the collected slurry was stirring-treated at 100° C. for 10 hours. After cooling to room temperature, 20 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Comparative Example 2-1 were obtained.

Comparative Example 2-2

After 2.5 g of the modifying material 2-A was dissolved in 80.0 g of toluene, 10.0 g of the zirconium oxide particle 2-D was put thereinto. After treating this liquid mixture with a sand grinder for 3 hours, the collected slurry was stirring-treated at 100° C. for 10 hours. After cooling to room temperature, 10 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Comparative Example 2-2 were obtained.

Comparative Example 2-3

After 10.0 g of the modifying material 2-F was dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After cooling to room temperature, 25 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Comparative Example 2-3 were obtained.

Comparative Example 2-4

After 5.0 g of the modifying material 2-G was dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After cooling to room temperature, 25 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Comparative Example 2-4 were obtained.

Comparative Example 2-5

After 3.0 g of the modifying material 2-A was dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After cooling to room temperature, 10 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Comparative Example 2-5 were obtained.

Comparative Example 2-6

After 16.0 g of the modifying material 2-A was dissolved in 80.0 g of toluene, 10.0 g of the zirconium oxide particle 2-A was put thereinto. After treating this liquid mixture with a sand grinder for 3 hours, the collected slurry was stirring-treated at 100° C. for 10 hours. After cooling to room temperature, 20 parts by mass of hexamethyl disilazane was added thereto with respect to 100 parts by mass of the zirconium oxide particles, and the mixture was stirring-treated at 100° C. for 5 hours. After filtering the obtained dispersion, toluene was removed by an evaporator, whereby modified particles of Comparative Example 2-6 were obtained.

(Evaluation of Surface-modified-metal-oxide-particle Material)

Various evaluations were performed on the surface-modified-metal-oxide-particle materials of Examples 2-1 to 2-10, Comparative Examples 2-1 to 2-6, and Reference Example 2-1 by the following device or method.

(1) Viscosity

The viscosity of the modified particles was measured using RheoStress RS-6000 (manufactured by Haake Technik) as a rheometer. Moreover, the viscosity of the modified particles was measured at a shear rate of 1.0 (1/s) and 25° C. The measurement results are shown in Tables 2 and 3.

(2) Transmittance

The modified particles were placed in a thin layer quartz cell having an optical path length of 1 mm, measurement was performed in a wavelength range of 350 nm to 800 nm using a spectrophotometer (V-570, manufactured by Jasco Corporation) with an integrating sphere. Here, a value obtained by measuring only quartz cell (air) was set to a blank. The measurement results of transmittance at a wavelength of 400 nm are shown in Tables 2 and 3. Moreover, at wavelengths longer than 400 nm, values higher than the transmittance at 400 nm were obtained.

TABLE 2

| | | Metal oxide particles | | Surface-modifying material | | | |
| --- | --- | --- | --- | --- | --- | --- | --- |
| | | Type | Average primary particle diameter [nm] | Modifying material kind | Modifying material type | One terminal | The other terminal |
| Example2 | -1 | ZrO$_2$ (2-A) | 4 | 2-A | Dimethyl silicone | Vinyl group | Ethoxy group |
| | -2 | ZrO$_2$ (2-A) | 4 | 2-B | Phenyl silicone | Vinyl group | Ethoxy group |
| | -3 | ZrO$_2$ (2-A) | 4 | 2-C | Phenyl silicone | Vinyl group | Ethoxy group |
| | -4 | ZrO$_2$ (2-A) | 4 | 2-D | Methyl phenyl silicone | Methyl group | Ethoxy group |
| | -5 | ZrO$_2$ (2-B) | 6 | 2-A | Dimethyl silicone | Vinyl group | Ethoxy group |
| | -6 | ZrO$_2$ (2-A) | 4 | CH$_2$=CH—Si—(OCH$_3$)$_3$ | Vinyl trimethoxy silane | Vinyl group | Methoxy group |
| | | | | 2-D | Phenyl silicone | Methyl group | Ethoxy group |
| | -7 | ZrO$_2$ (2-A) | 4 | 2-E | Dimethyl silicone | Methyl group | Ethoxy group |
| | | | | 2-A | Dimethyl silicone | Vinyl group | Ethoxy group |
| | -8 | TiO$_2$ | 4 | 2-B | Phenyl silicone | Vinyl group | Ethoxy group |
| | -9 | ZnO | 4 | 2-B | Phenyl silicone | Vinyl group | Ethoxy group |
| | -10 | Si$_2$O | 5 | 2-A | Dimethyl silicone | Vinyl group | Ethoxy group |

TABLE 2-continued

| | | Surface-modifying material | | silylation material | | | |
|---|---|---|---|---|---|---|---|
| | | N in the formula | Amount of surface-modifying material vs 100 parts by weight of particles | Type | Amount of silylation material vs 100 parts by weight of particles | Viscosity of modified particles [Pa·s] | Transmittance of modified particles [%] |
| Example 2 | -1 | 60 | 80 | Hexamethyldisilazane | 20 | 50 | 86 |
| | -2 | 60 | 80 | Hexamethyldisilazane | 20 | 62 | 83 |
| | -3 | 45 | 50 | Hexamethyldisilazane | 20 | 72 | 81 |
| | -4 | 60 | 50 | Hexamethyldisilazane | 20 | 51 | 84 |
| | -5 | 60 | 65 | Hexamethyldisilazane | 15 | 54 | 70 |
| | -6 | — | 30 | Hexamethyldisilazane | 15 | 60 | 80 |
| | | 30 | 40 | | | | |
| | -7 | 60 | 40 | Hexamethyldisilazane | 20 | 55 | 86 |
| | | 60 | 40 | | | | |
| | -8 | 60 | 80 | Hexamethyldisilazane | 20 | 65 | 70 |
| | -9 | 60 | 80 | Hexamethyldisilazane | 20 | 50 | 87 |
| | -10 | 60 | 80 | Hexamethyldisilazane | 20 | 45 | 93 |

TABLE 3

| | | Metal oxide particles | | Surface-modifying material | | | | | Amount of surface-modifying material vs 100 parts by weight of particles | Silylation material | Amount of silylation material vs 100 parts by weight of particles | Viscosity of modified particles [Pa·s] | Transmittance of modified particles [%] |
|---|---|---|---|---|---|---|---|---|---|---|---|---|---|
| | | Type | Average primary particle diameter [nm] | Modifying material kind | Modifying material type | One terminal | The other terminal | N in the formula | | Type | | | |
| Reference Example 2 | -1 | ZrO₂ (2-A) | 4 | 2-A | Dimethyl silicone | Vinyl group | Ethoxy group | 60 | 80 | None | | 820 | 86 |
| Comparative Exampe 3 | -1 | ZrO₂ (2-C) | 2 | 2-A | Dimethyl silicone | Vinyl group | Ethoxy group | 60 | 100 | Hexamethyldisilazane | 20 | 4500 | 90 |
| | -2 | ZrO₂ (2-D) | 15 | 2-A | Dimethyl silicone | Vinyl group | Ethoxy group | 80 | 25 | Hexamethyldisilazane | 10 | 990 | 0 |
| | -3 | ZrO₂ (2-A) | 1 | 2-F | Dimethyl silicone | Vinyl group | Ethoxy group | 3 | 100 | Hexamethyldisilazane | 25 | >10000 | Measurement is impossible (transparent) |
| | -4 | ZrO₂ (2-A) | 4 | 2-G | Dimethyl silicone | Vinyl group | Ethoxy group | 150 | 50 | Hexamethyldisilazane | 25 | >10000 | Measurement is impossible (transparent) |
| | -5 | ZrO₂ (2-A) | 4 | 2-A | Dimethyl silicone | Vinyl group | Ethoxy group | 60 | 30 | Hexamethyldisilazane | 10 | >10000 | 80 |
| | -6 | ZrO₂ (2-A) | 4 | 2-A | Dimethyl silicone | Vinyl group | Ethoxy group | 60 | 160 | Hexamethyldisilazane | 20 | 1500 | 88 |

In the surface-modified-metal-oxide-particle materials in Examples 2-1 to 2-10, since the surface-modified-metal-oxide-particles were formed by performing the first surface modification on metal oxide particles having the average primary particle diameter of 3 nm to 10 nm with a surface-modifying material including a silicone compound represented by the formula (1) described above and by performing a second surface modification with a silylation material, the viscosity at 25° C. was 100 Pa·s or less, and the transmittance of light at a wavelength of 400 nm to 800 nm was 60% or greater at a thickness of 1 mm.

On the other hand, in the surface-modified-metal-oxide-particle materials in Comparative Examples 2-1 to 2-6, the viscosity at 25° C. exceeded 100 Pa·s. Here, in the surfacemodified-metal-oxide-particle material in Comparative Example 2-1, since the average primary particle diameter of the metal oxide particles was excessively small, and by this, interaction among particles occurred, the viscosity was high. In the surface-modified-metal-oxide-particle material in Comparative Example 2-2, since the average primary particle diameter of the metal oxide particles was large, and by this, scattering occurred, and thus the transmittance of light was reduced, and the total mixing amount of the surface-modifying material and the silylation material with respect to the metal oxide particles was small, the viscosity was also high as 990 Pa·s. In the surface-modified-metal-oxide-particle material in Comparative Example 2-3, since the silicone chain of the silicone compound represented by the formula (1) described above was excessively short, and by this, the interaction among particles occurred, the viscosity was high. In the surface-modified-metal-oxide-particle material in Comparative Example 2-4, since the silicone chain of the silicone compound represented by the formula (1) described above was excessively long, the viscosity was high. In the surface-modified-metal-oxide-particle material in Comparative Examples 2-5 and 2-6, since the total mixing amount of the surface-modifying material and the silylation material with respect to the metal oxide particles was small, the viscosity was high.

In addition, in the surface-modified-metal-oxide-particle material in Reference Examples 2-1, since the second surface modification by the silylation material was not performed, the viscosity was higher compared to those in Examples 2-1 to 2-10 in which the second surface modification was performed, and the viscosity at 25° C. exceeded 100 Pa·s. This is considered that this was because a hydroxyl group remained.

Manufacture and Evaluation of Composition for Sealing Optical Semiconductor Element and Optical Semiconductor Device Example 2-11

10 g of the modified particles of Example 2-2, and 10 g of a methyl silicone resin (which is formed by mixing A liquid and B liquid of OE-6630 manufactured by Dow Corning Toray Co., Ltd. at a mass ratio of 1:4) as a sealing material were mixed using a commercially available rotation-revolution mixer (AR-100 manufactured by THINKY), whereby a composition for sealing optical semiconductor element of Example 2-11 (surface-modified-metal-oxide-particle material-containing composition for sealing optical semiconductor element) was manufactured.

There was no problem at all in mixing during manufacture of the composition for sealing optical semiconductor element, and a homogeneous mixed composition of the modified particles and the methyl silicone resin was obtained. The viscosity of the obtained mixed composition at 25° C. was 15 Pa·s, and the transmittance of light at a wavelength of 400 nm to 800 nm and a thickness of 1 mm was 78%.

Next, 10 g of the modified particles of Example 2-2, 10 g of a methyl silicone resin (which is formed by mixing A liquid and B liquid of OE-6630 manufactured by Dow Corning Toray Co., Ltd. at a mass ratio of 1:4) as a sealing material, 2 g of a phosphor (GLD(Y)-550A manufactured by GeneLite Inc.), and 0.5 g of toluene were mixed using a commercially available rotation-revolution mixer (AR-100 manufactured by THINKY), whereby a composition for sealing optical semiconductor element containing a phosphor of Example 2-11 (surface-modified-metal-oxide-particle material-containing composition for sealing optical semiconductor element) was manufactured.

There was no problem at all in mixing during manufacture, and a homogeneous mixed composition of the modified particles, the methyl silicone resin, and the phosphor were obtained.

The obtained composition for sealing optical semiconductor element containing a phosphor of Example 2-11 was injected into a package provided with commercially available optical semiconductor elements using a dispenser. Next, the composition for sealing optical semiconductor element was cured by performing a heat-treatment at 150° C. for 1 hour, whereby an optical semiconductor device of Example 2-11 was obtained.

The injection work of the composition for sealing optical semiconductor element containing a phosphor of Example 2-11 could be performed in the same manner as in a case of a methyl silicone resin simple substance which does not include the modified particles, and there was no problem with the injection. In addition, since an organic solvent was not included in the composition for sealing optical semiconductor, solvent removal during curing was not necessary, and a curing process could be performed in the same manner as in the resin simple substance, and therefore, an optical semiconductor device could be manufactured without any problem. In addition, it could be confirmed that the luminance of the obtained optical semiconductor device was improved compared to the case in which only the methyl silicone resin and phosphor were used as a sealing material.

REFERENCE SIGNS LIST

10 . . . Light emitting device
12 . . . Reflection cup
12A . . . Recess portion
14 . . . Light emitting element
16 . . . First sealing material layer

The invention claimed is:

1. A surface-modified-metal-oxide-particle material consisting of:
metal oxide particles and surface-modifying material reacted to bonded to the surface of the metal oxide particles,
wherein the surface-modifying material consists of a silicone compound represented by the following formula (1) and at least one silane compound, an average primary particle diameter of the metal oxide particles is 3 nm to 10 nm, a viscosity of the surface-modified-metal-oxide-particle material at 25° C. is 1000 Pa·s or less, and a transmittance of light at a wavelength of 400 nm to 800 nm and a thickness of 1 mm of the surface-modified-metal-oxide-particle material is 60% or greater:

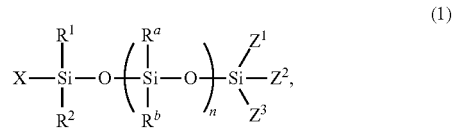

wherein in the formula (1), X represents a hydrogen atom, an alkyl group having 1 to 6 carbon atoms, or an alkenyl group having 2 to 6 carbon atoms, and each of $R^1$, $R^2$, $R^a$, and $R^b$ independently represents a hydrogen atom, an alkyl group having 1 to 6 carbon atoms, a phenyl group, or an alkenyl group having 2 to 6 carbon atoms, each of $Z^1$ to $Z^3$ independently represents an alkyl group having 1 to 6 carbon atoms, an alkoxy group having 1 to 6 carbon atoms, a hydroxy group, a halogen atom, or a carboxy group, and at least one of $Z^1$ to $Z^3$ represents an alkoxy group having 1 to 6 carbon atoms, a hydroxy group, a halogen atom, or a carboxy group, n is an integer of 30 to 70, a plurality of $R^a$ may be the same as or different from each other, and a plurality of $R^b$ may be the same as or different from each other.

2. The surface-modified-metal-oxide-particle material according to claim 1,
wherein the refractive index of the metal oxide particles is 1.7 or higher, a volume ratio of the surface-modifying material with respect to the metal oxide particles (surface-modifying material/metal oxide particles) is 1.5 to 9, and the refractive index of the surface-modified-metal-oxide-particle material is 1.48 or higher.

3. The surface-modified-metal-oxide-particle material according to claim 1,
wherein the silicone compound represented by the formula (1) is represented by the following formula (2):

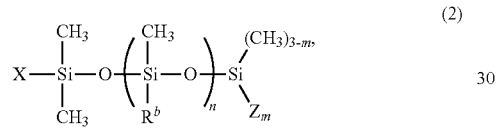

wherein in the formula (2), X, $R^b$, and n are the same as those in the formula (1), Z represents an alkoxy group having 1 to 6 carbon atoms, a hydroxy group, a halogen atom, or a carboxy group, and m is an integer of 1 to 3.

4. The surface-modified-metal-oxide-particle material according to claim 1,
wherein the metal oxide particles comprise zirconia.

5. The surface-modified-metal-oxide-particle material according to claim 1,
wherein the metal oxide particles consist of zirconia.

6. A composition for sealing an optical semiconductor element comprising:
the surface-modified-metal-oxide-particle material according to claim 1.

7. An optical semiconductor device,
wherein optical semiconductor elements are sealed by a sealing material layer of at least one layer comprising a first sealing material layer in contact with the optical semiconductor element, wherein the first sealing material layer contains the composition for sealing optical semiconductor element according to claim 6.

8. The optical semiconductor device according to claim 7,
wherein a second sealing material layer having a composition ratio different from the composition for sealing an optical semiconductor element is formed on the first sealing material layer.

9. A surface-modified-metal-oxide-particle material consisting of:
metal oxide particles and surface-modifying material reacted to bond to the surface of the metal oxide particles, wherein the surface-modifying material consists of a first surface-modifying material and a second surface-modifying material, wherein the metal oxide particles are surface modified by performing a first surface modification on metal oxide particles with the first surface-modifying material and then performing a second surface modification with the second surface-modifying material,
wherein the first surface-modifying material consists of a silicone compound represented by the following formula (1) and at least one silane compound, an average primary particle diameter of the metal oxide particles is 3 nm to 10 nm, and a transmittance of light at a wavelength of 400 nm to 800 nm and a thickness of 1 mm of the surface-modified-metal-oxide-particle material is 60% or greater:

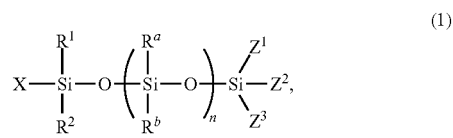

wherein in the formula (1), X represents a hydrogen atom, an alkyl group having 1 to 6 carbon atoms, or an alkenyl group having 2 to 6 carbon atoms, and each of $R^1$, $R^2$, $R^a$, and $R^b$ independently represents a hydrogen atom, an alkyl group having 1 to 6 carbon atoms, a phenyl group, or an alkenyl group having 2 to 6 carbon atoms, each of $Z^1$ to $Z^3$ independently represents an alkyl group having 1 to 6 carbon atoms, an alkoxy group having 1 to 6 carbon atoms, a hydroxy group, a halogen atom, or a carboxy group, and at least one of $Z^1$ to $Z^3$ represents an alkoxy group having 1 to 6 carbon atoms, a hydroxy group, a halogen atom, or a carboxy group, n is an integer of 30 to 70, a plurality of $R^a$ may be the same as or different from each other, and a plurality of $R^b$ may be the same as or different from each other, and
wherein the second surface-modifying material consists of a silylation material which hydrophobizes a hydroxyl group, and a viscosity of the surface-modified-metal-oxide-particle material at 25° C. is 100 Pa·s or less.

10. The surface-modified-metal-oxide-particle material according to claim 9,
wherein the total mixing amount of the first surface-modifying material is 50 parts by mass to 150 parts by mass with respect to 100 parts by mass of the metal oxide particles.

11. The surface-modified-metal-oxide-particle material according to claim 9,
wherein the silicone compound represented by the formula (1) is represented by the following formula (2):

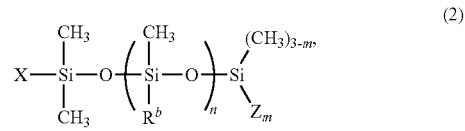

wherein in the formula (2), X, $R^b$, and n are the same as those in the formula (1), Z represents an alkoxy group having 1 to 6 carbon atoms, a hydroxy group, a halogen atom, or a carboxy group, and m is an integer of 1 to 3.

12. A composition for sealing an optical semiconductor element comprising:
the surface-modified-metal-oxide-particle material according to claim 9.

13. An optical semiconductor device,
wherein optical semiconductor elements are sealed by a sealing material layer of at least one layer comprising a first sealing material layer in contact with the optical semiconductor element, wherein the first sealing material layer contains the composition for sealing optical semiconductor element according to claim 12.

14. The optical semiconductor device according to claim 13,
wherein a second sealing material layer having a composition ratio different from the composition for an sealing optical semiconductor element is formed on the first sealing material layer.

* * * * *